(12) United States Patent
Yoon et al.

(10) Patent No.: US 12,740,149 B2
(45) Date of Patent: Sep. 15, 2026

(54) DISPLAY DEVICE

(71) Applicant: LG DISPLAY CO., LTD., Seoul (KR)

(72) Inventors: Yeongmin Yoon, Gimpo si (KR); MyeongJun Kim, Goyang si (KR)

(73) Assignee: LG Display Co., Ltd., Seoul (KR)

( * ) Notice: Subject to any disclaimer, the term of this patent is extended or adjusted under 35 U.S.C. 154(b) by 495 days.

(21) Appl. No.: 18/449,240

(22) Filed: Aug. 14, 2023

(65) Prior Publication Data

US 2024/0113134 A1 Apr. 4, 2024

(30) Foreign Application Priority Data

Oct. 4, 2022 (KR) ........................ 10-2022-0126214

(51) Int. Cl.

*H10D 86/60* (2025.01)
*H10D 86/40* (2025.01)
*H10W 90/00* (2026.01)

(52) U.S. Cl.

CPC ........... *H10D 86/60* (2025.01); *H10D 86/441* (2025.01); *H10W 90/00* (2026.01)

(58) Field of Classification Search

None

See application file for complete search history.

(56) References Cited

U.S. PATENT DOCUMENTS

2021/0192988 A1* 6/2021 Kim .................... H01L 23/5386

FOREIGN PATENT DOCUMENTS

KR 20210082061 A1 7/2021

* cited by examiner

*Primary Examiner* — Bo B Jang

(74) *Attorney, Agent, or Firm* — PnK IP LLC

(57) ABSTRACT

A display device includes a plurality of pixel substrates disposed on a lower substrate to be spaced apart from each other and where at least one pixel is disposed; a plurality of connection substrates which includes a plurality of curved areas configured to connect a plurality of adjacent pixel substrates, among the plurality of pixel substrates; and a plurality of connection lines configured to electrically connect pads disposed on the plurality of adjacent pixel substrates on the plurality of connection substrates, and the connection substrate includes a first side surface and a second side surface and the second side surface has a different tilt angle from that of the first side surface, thereby improving the stretching reliability.

21 Claims, 17 Drawing Sheets

DISPLAY DEVICE

CROSS-REFERENCE TO RELATED APPLICATION

This application claims the priority of Korean Patent Application No. 10-2022-0126214 filed on Oct. 4, 2022, which is hereby incorporated by reference in its entirety.

BACKGROUND

Field of the Disclosure

The present disclosure relates to a display device, and more particularly to a stretchable display device.

Background

As display devices which are used for a monitor of a computer, a TV, or a cellular phone, there are an organic light emitting display (OLED) device which is a self-emitting device and a liquid crystal display (LCD) device which requires a separate light source.

An applicable range of the display device is diversified to personal digital assistants as well as a monitor of a computer and a TV, and a display device with a large display area and a reduced volume and weight is being studied.

Recently, a display device which is manufactured by forming a display unit and a wiring line on a flexible substrate such as plastic which is a flexible material to be stretchable in a specific direction and changed in various forms is getting attention as a next generation display device.

SUMMARY

Accordingly, the present disclosure is directed to a display device that substantially obviates one or more of problems due to limitations and disadvantages described above.

More specifically, the present disclosure is to provide a display device which may minimize a resistance of a connection line.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

In addition, the present disclosure is to provide a display device which may minimize a stress of a stretching line.

Further, the present disclosure is to provide a display device which may improve a stretching rate.

The present disclosure is not limited to the above-mentioned and other features, which are not mentioned above, may be clearly understood by those skilled in the art from the following descriptions.

To achieve the above-described features and in accordance with the present disclosure, as embodied and broadly described, a display device includes a plurality of pixel substrates disposed on a lower substrate to be spaced apart from each other and where at least one pixel is disposed; a plurality of connection substrates which includes a plurality of curved areas configured to connect a plurality of adjacent pixel substrates, among the plurality of pixel substrates; and a plurality of connection lines configured to electrically connect pads disposed on the plurality of adjacent pixel substrates on the plurality of connection substrates, and the connection substrate includes a first side surface and a second side surface and the second side surface has a different tilt angle from that of the first side surface, thereby improving the stretching reliability.

Other detailed matters of the exemplary aspects are included in the detailed description and the drawings.

According to an aspect of the present disclosure, a connection line is disposed on a tilt surface to increase an area of the connection line of the display device, thereby reducing a resistance of the connection line.

According to an aspect of the present disclosure, a width of the connection line is reduced to improve a stretching rate of the display device.

According to the present disclosure, the connection line is disposed on the connection substrate to have different thicknesses to reduce a deviation in resistance of the connection line in a curved area and a straight area.

The effects according to the present disclosure are not limited to the contents exemplified above, and more various effects are included in the present disclosure.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
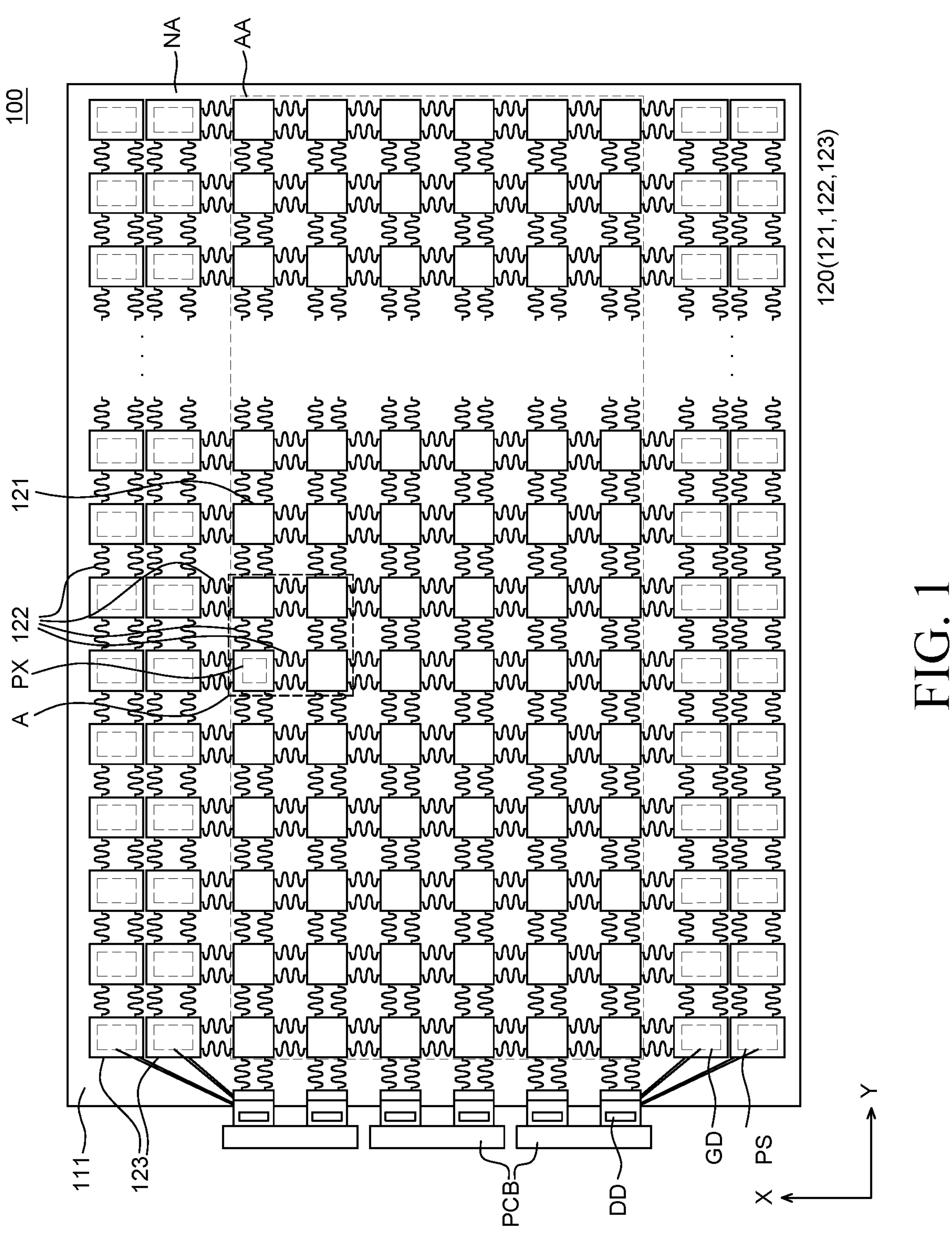
FIG. 1 is a plan view of a display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art may fully understand the disclosures of the present disclosure and the scope of the present disclosure.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure may be partially or entirely adhered to or combined with each other and may be interlocked and operated in technically various ways, and the aspects may be carried out independently of or in association with each other.

Hereinafter, a display device according to exemplary aspects of the present disclosure will be described in detail with reference to accompanying drawings.

A display device according to an exemplary aspect of the present disclosure is a display device which is capable of displaying images even in a bent or extended state and may be also referred to as a display device, a flexible display device and a stretchable display device. As compared with the general display devices of the related art, the display device may have not only a high flexibility, but also stretchability. Therefore, the user may bend or extend a display device, and a shape of a display device may be freely changed in accordance with manipulation of a user. For example, when the user pulls the display device by holding ends of the display device, the display device may be extended to the pulling direction of the user. Alternatively, when the user disposes the display device on an outer surface which is not flat, the display device may be disposed to be bent in accordance with the shape of the outer surface of the wall. Further, when a force applied by the user is removed, the display device may return to its original shape.

<Stretchable Substrate and Pattern Layer>

FIG. 1 is a plan view of a display device according to an exemplary aspect of the present disclosure.

Figure 2:
FIG. 2 is an enlarged plan view of an active area of a display device according to an exemplary aspect of the present disclosure.
Figure 2:
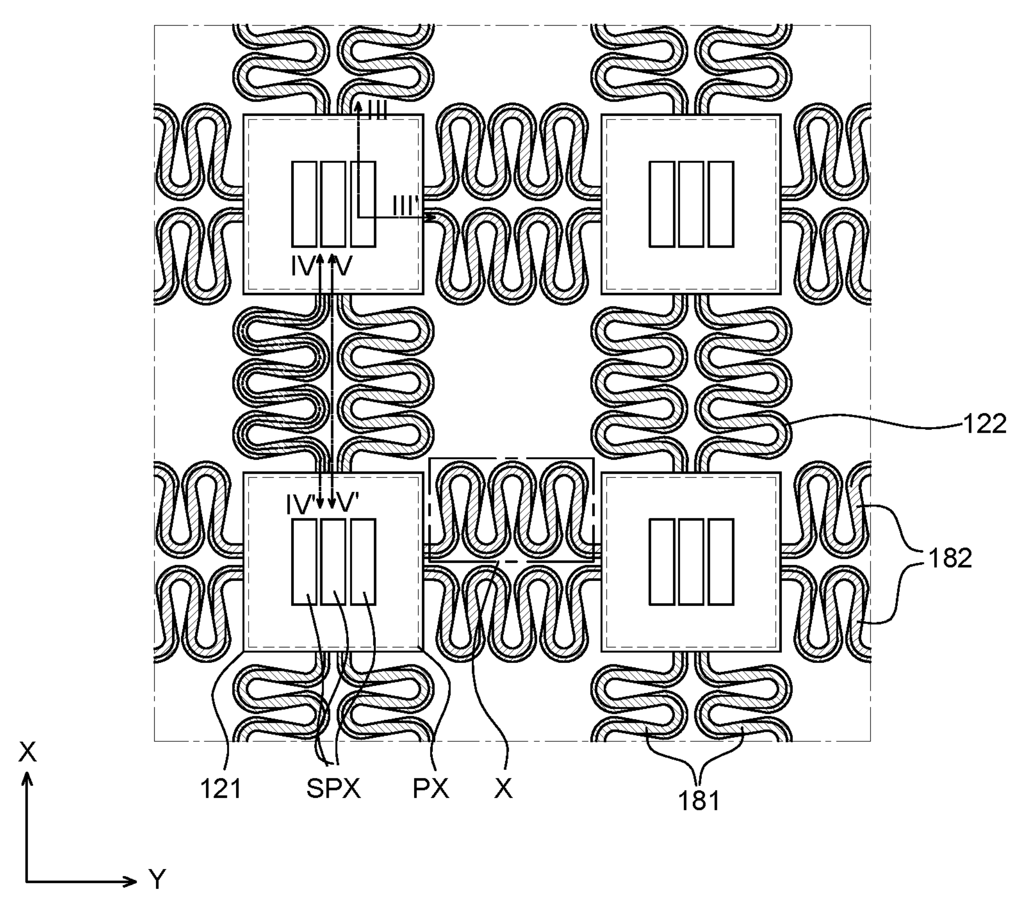

FIG. 2 is an enlarged plan view of an active area of a display device according to an exemplary aspect of the present disclosure.

Figure 3:
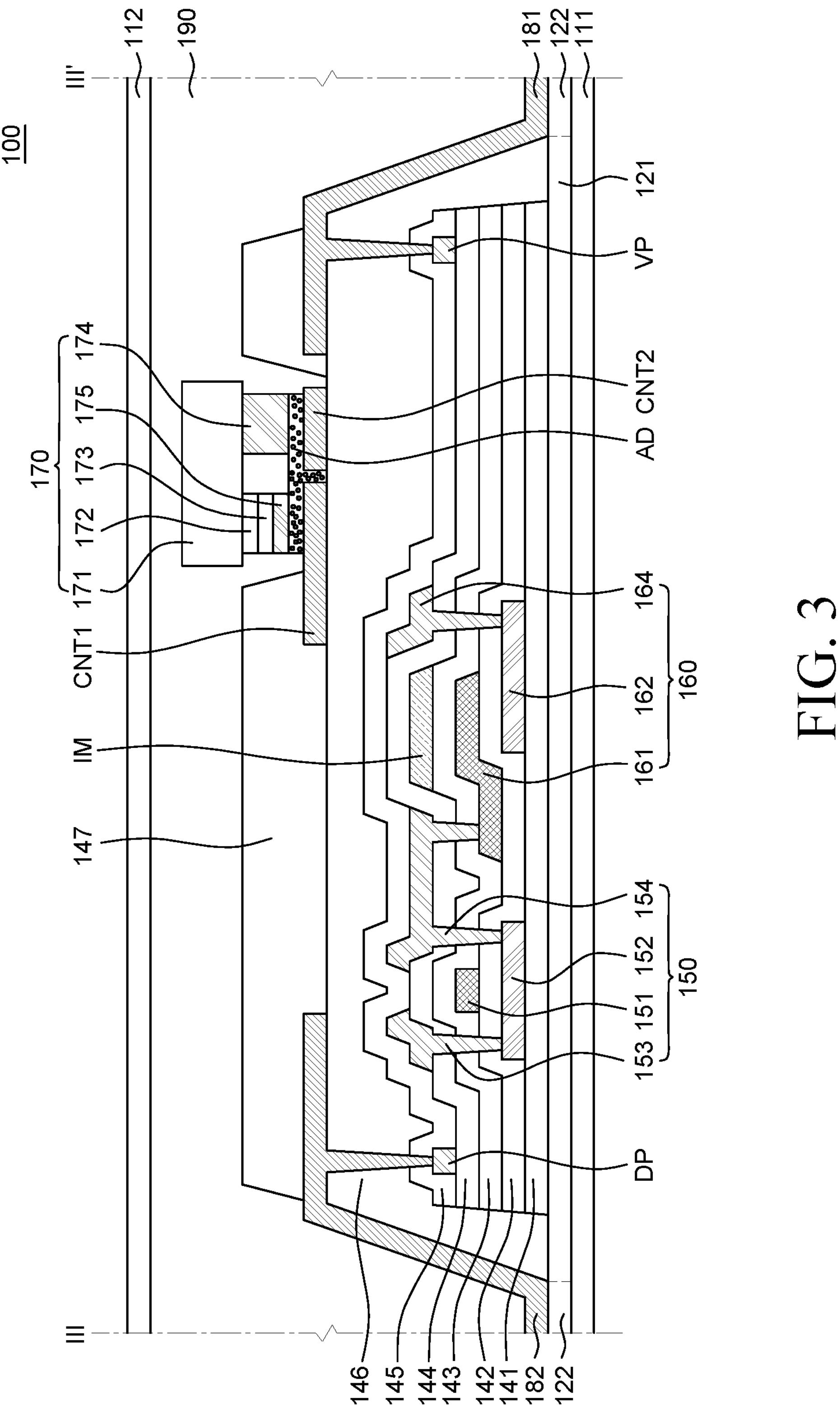
FIG. 3 is a cross-sectional view taken along line of FIG. 2.

FIG. 3 is a cross-sectional view taken along line of FIG. 2.

Specifically, FIG. 2 is an enlarged plan view of an area A illustrated in FIG. 1.

Referring to FIG. 1, a display device 100 according to an exemplary aspect of the present disclosure may include a lower substrate 111, a pattern layer 120, a plurality of pixels PX, a gate driver GD, a data driver DD, and a power supply PS. In FIG. 1, for the sake of convenience, a filling layer 190 and an upper substrate 112 are not illustrated.

The lower substrate 111 is a substrate which supports and protects several components of the display device 100. The upper substrate 112 is a substrate which covers and protects several components of the display device 100. That is, the lower substrate 111 is a substrate which supports the pattern layer 120 on which the pixels PX, the gate driver GD, and the power supply PS are formed. The upper substrate 112 is a substrate which covers the pixels PX, the gate driver GD, and the power supply PS.

Each of the lower substrate 111 and the upper substrate 112 which are flexible substrates may be configured by an insulating material which is bendable or extendable. For example, each of the lower substrate 111 and the upper substrate 112 may be formed of a silicone rubber such as polydimethylsiloxane (PDMS) or an elastomer such as polyurethane (PU) and polytetrafluoroethylene (PTFE), and thus may have a flexibility. Further, the materials of the lower substrate 111 and the upper substrate 112 may be the same, but are not limited thereto and may vary.

Each of the lower substrate 111 and the upper substrate 112 are flexible substrates to be reversibly expandable and contractible. Accordingly, the lower substrate 111 may be referred to as a lower stretchable substrate, a lower stretching substrate, a lower extending substrate, a lower ductile substrate, a lower flexible substrate, a first stretchable substrate, a first stretching substrate, a first extending substrate, a first ductile substrate, or a first flexible substrate. The upper substrate 112 may also be referred to as an upper stretchable substrate, an upper stretching substrate, an upper extending substrate, an upper ductile substrate, an upper flexible substrate, a second stretchable substrate, a second stretching substrate, a second extending substrate, a second ductile substrate, or a second flexible substrate. Further, moduli of elasticity of the lower substrate 111 and the upper substrate 112 may be several MPa to several hundreds of MPa. Further, a ductile breaking rate of the lower substrate 111 and the upper substrate 112 may be 100% or higher. Here, the ductile breaking rate refers to a stretching rate at a timing when an object to be stretched is broken or cracked. A thickness of the lower substrate 111 may be 10 um to 1 mm, but is not limited thereto.

The lower substrate 111 may have an active area AA and a non-active area NA which encloses the active area AA. However, the active area AA and the non-active area NA are not mentioned to be limited to the lower substrate 111, but may be mentioned over the entire display device 100.

The active area AA is an area in which images are displayed in the display device 100. The plurality of pixels PX is disposed in the active area AA. Each pixel PX may include a display element and various driving elements for driving the display element. Various driving elements may refer to at least one thin film transistor (TFT) and a capacitor, but are not limited thereto. The plurality of pixels PX may be connected to various wiring lines, respectively. For example, each of the plurality of pixels PX may be connected to various wiring lines, such as a gate line, a data line, a high potential voltage line, a low potential voltage line, a reference voltage line, and an initialization voltage line.

The non-active area NA is an area where no image is displayed. The non-active area NA may be an area adjacent to the active area AA. The non-active area NA is adjacent to the active area AA to enclose the active area AA. However, it is not limited thereto so that the non-active area NA corresponds to an area excluding the active area AA from the lower substrate 111 and may be modified and separated in various forms. Components for driving the plurality of pixels PX disposed in the active area AA are disposed in the non-active area NA. That is, the gate driver GD and the power supply PS may be disposed in the non-active area NA. In the non-active area NA, a plurality of pads connected to the gate driver GD and the data driver DD may be disposed and each pad may be connected to each of the plurality of pixels PX of the active area AA.

On the lower substrate 111, a pattern layer 120 including a plurality of pixel substrates 121 disposed in the active area AA and a plurality of connection substrates 122 and a plurality of circuit substrates 123 disposed in the non-active area NA is disposed.

The plurality of pixel substrates 121 is disposed in the active area AA of the lower substrate 111 and a plurality of pixels PX is formed on the plurality of pixel substrates 121. The plurality of circuit substrates 123 may be disposed in the non-active area NA of the lower substrate 111. The gate driver GD and the power supply PS are formed on the plurality of circuit substrates 123.

The plurality of pixel substrates 121 and the plurality of circuit substrates 123 may be disposed as island shapes which are spaced apart from each other. The plurality of pixel substrates 121 and the plurality of circuit substrates 123 may be individually separated, respectively. Therefore, the plurality of pixel substrates 121 and the plurality of circuit substrates 123 may be referred to as a first island pattern and a second island pattern or a first individual pattern and a second individual pattern.

Specifically, the gate driver GD may be mounted in the plurality of circuit substrates 123. The gate driver GD may be formed on the circuit substrate 123 in a gate in panel (GIP) manner when various elements on the pixel substrate 121 are manufactured. Therefore, various circuit configurations which configure the gate driver GD, such as various transistors, capacitors, and wiring lines, may be disposed on the plurality of circuit substrates 123. However, it is not limited thereto and the gate driver GD may also be mounted in a chip on film (COF) manner.

The power supply PS may be mounted in the plurality of circuit substrates 123. The power supply PS is a plurality of power blocks patterned when various components on the pixel substrate 121 is manufactured and may be formed on the circuit substrate 123. Therefore, power blocks disposed on different layers may be disposed on the circuit substrate 123. That is, a lower power block and an upper power block may be sequentially disposed on the circuit substrate 123. A low potential voltage may be applied to the lower power block and a high potential voltage may be applied to the upper power block. Therefore, the low potential voltage may be supplied to the plurality of pixels PX by means of the lower power block. The high potential voltage may be supplied to the plurality of pixels PX by means of the upper power block.

Referring to FIG. 1, a size of the plurality of circuit substrates 123 may be larger than a size of the plurality of pixel substrates 121. Specifically, a size of each of the plurality of circuit substrates 123 may be larger than a size of each of the plurality of pixel substrates 121. As described above, on each of the plurality of circuit substrates 123, the gate driver GD is disposed and one stage of the gate driver GD may be disposed on each of the plurality of circuit substrates 123. Therefore, an area occupied by various circuit configurations which configure one stage of the gate driver GD may be relatively larger than an area occupied by the pixel PX so that a size of each of the plurality of circuit substrates 123 may be larger than a size of each of the plurality of pixel substrates 121.

Even though in FIG. 1, the plurality of circuit substrates 123 is disposed on both sides of the non-active area NA in the first direction X, it is not limited thereto and may be disposed in an arbitrary area of the non-active area NA. Further, even though it is illustrated that the plurality of pixel substrates 121 and the plurality of circuit substrates 123 have a quadrangular shape, it is not limited thereto and the plurality of pixel substrates 121 and the plurality of circuit substrates 123 may vary in various forms.

Referring to FIGS. 1 and 3, the plurality of connection substrates 122 may be disposed between the plurality of pixel substrates 121 to connect pixel substrates 121 which are adjacent to each other in the active area AA. The plurality of connection substrates 122 may be disposed between the pixel substrate 121 and the circuit substrate 123 which are adjacent to each other or between the plurality of adjacent circuit substrates 123 to connect the pixel substrate 121 and the circuit substrate 123 which are adjacent to each other in the non-active area NA or connect the plurality of pixel substrates 123 which is adjacent to each other.

Referring to FIG. 1, the plurality of connection substrates 122 has a wavy shape. For example, the plurality of connection substrates 122 may have a sine wave shape. However, the shape of the plurality of connection substrates 122 is not limited thereto, and for example, the plurality of connection substrates 122 may extend in a zigzag shape. Alternatively, the plurality of connection substrates 122 may have various shapes, such as a plurality of diamond-shaped substrates connected and extended at vertices. Further, the number and the shape of the plurality of connection substrates 122 illustrated in FIG. 1 are illustrative and the number and the shape of the plurality of connection substrates 122 may vary depending on the design.

The plurality of pixel substrates 121 and the plurality of circuit substrates 123 are rigid patterns. That is, the plurality of pixel substrates 121 and the plurality of circuit substrates 123 may be more rigid than the lower substrate 111 and the upper substrate 112. Accordingly, the modulus of elasticity of the plurality of pixel substrates 121 and the plurality of circuit substrates 123 may be higher than the modulus of elasticity of the lower substrate 111. The modulus of elasticity is a parameter representing a rate of deformation against the stress applied to the substrate and the higher the modulus of elasticity, the higher relatively the hardness. Therefore, the plurality of pixel substrates 121 and the plurality of circuit substrates 123 may be referred to as a plurality of first rigid patterns and a plurality of second rigid patterns, respectively. The moduli of elasticity of the plurality of pixel substrates 121 and the plurality of circuit substrates 123 may be 1000 times higher than the moduli of elasticity of the lower substrate 111 and the upper substrate 112, but are not limited thereto.

The plurality of pixel substrates 121 and the plurality of circuit substrates 123 which are the plurality of rigid substrates may be formed of plastic material having a flexibility lower than that of the lower substrate 111 and the upper substrate 112. For example, the plurality of pixel substrates 121 and the plurality of circuit substrates 123 may be formed of polyimide (PI), polyacrylate, or polyacetate. In this case, the plurality of pixel substrates 121 and the plurality of circuit substrates 123 may be formed of the same material, but are not limited thereto and may be formed of different materials from each other. When the plurality of pixel substrates 121 and the plurality of circuit substrates 123 are formed of the same material, the plurality of pixel substrates 121 and the plurality of circuit substrates 123 may be integrally formed.

In some exemplary aspects, the lower substrate 111 may be defined to include a plurality of first lower patterns and a second lower pattern. The plurality of first lower patterns may be an area of the lower substrate 111 overlapping with the plurality of pixel substrates 121 and the plurality of circuit substrates 123. The second lower pattern may be an area which does not overlap with the plurality of pixel substrates 121 and the plurality of circuit substrates 123.

Further, the upper substrate 112 may be defined to include a plurality of first upper patterns and a second upper pattern. The plurality of first upper patterns may be an area of the upper substrate 112 overlapping with the plurality of pixel substrates 121 and the plurality of circuit substrates 123 and the second upper pattern may be an area which does not overlap with the plurality of pixel substrates 121 and the plurality of circuit substrates 123.

At this time, moduli of elasticity of the plurality of first lower patterns and the first upper pattern may be higher than moduli of elasticity of the second lower pattern and the second upper pattern. For example, the plurality of first lower patterns and the first upper pattern may be formed of the same material as the plurality of pixel substrates 121 and the plurality of circuit substrates 123. The second lower pattern and the second upper pattern may be formed of a material having a modulus of elasticity lower than those of the plurality of pixel substrates 121 and the plurality of circuit substrate 123.

That is, the first lower pattern and the first upper pattern may also be formed of polyimide (PI), polyacrylate, or polyacetate. For example, the second lower substrate and the second upper substrate may be formed of a silicone rubber such as polydimethylsiloxane (PDMS) or an elastomer such as polyurethane (PU) or polytetrafluoroethylene (PTFE).

<Driving Element of Non-Active Area>

The gate driver GD is a component which supplies a gate voltage to the plurality of pixels PX disposed in the active area AA. The gate driver GD includes a plurality of stages formed on the plurality of circuit substrates 123 and each stage of the gate driver GD may be electrically connected to each other by means of the plurality of gate connection lines. Accordingly, a gate voltage output from any one of stages may be transmitted to the other stage. Each stage may sequentially supply the gate voltage to the plurality of pixels PX connected to each stage.

The power supply PS is connected to the gate driver GD to supply a gate driving voltage and a gate clock voltage. The power supply PS is connected to the plurality of pixels PX to supply a pixel driving voltage to each of the plurality of pixels PX. The power supply PS may be formed on the plurality of circuit substrates 123. That is, the power supply PS may be formed to be adjacent to the gate driver GD on the circuit substrate 123. Power supplies PS formed on the plurality of circuit substrates 123 may be electrically connected to the gate driver GD and the plurality of pixels PX, respectively. That is, the plurality of power supplies PS formed on the plurality of circuit substrates 123 may be connected by a gate power supply connection line and a pixel power supply connection line. Therefore, each of the plurality of power supplies PS may supply a gate driving voltage, a gate clock voltage, and a pixel driving voltage.

The printed circuit board PCB is a component which transmits signals and voltages for driving the display element from the control unit to the display element. Therefore, the printed circuit board PCB may also be referred to as a driving substrate. A control unit such as an IC chip or a circuit unit may be mounted on the printed circuit board PCB. Further, on the printed circuit board PCB, a memory or a processor may also be mounted. The printed circuit board 130 provided in the display device 100 may include a stretching area and a non-stretching area to ensure stretchability. In the non-stretching area, an IC chip, a circuit unit, a memory, and a processor may be mounted and in the stretching area, wiring lines which are electrically connected to the IC chip, the circuit unit, the memory, and the processor may be disposed.

The data driver DD is a component which supplies a data voltage to the plurality of pixels PX disposed in the active area AA. The data driver DD may be configured as an IC chip so that it may be also referred to as a data integrated circuit D-IC. The data driver DD may be mounted in the non-stretching area of the printed circuit board PCB. That is, the data driver DD may be mounted on the printed circuit board PCB in the form of a chip on board (COB). However, even though in FIG. 1, it is illustrated that the data driver DD is mounted in a chip on film (COF) manner, it is not limited thereto and the data driver DD may also be mounted by a chip on board (COB), a chip on glass (COG), or a tape carrier package (TCP) manner.

Further, even though in FIG. 1, one data driver DD is disposed to correspond to one line of the pixel substrates 121 disposed in the active area AA, it is not limited thereto. That is, one data driver DD may be disposed to correspond to a plurality of lines of pixel substrates 121.

Hereinafter, the active area AA of the display device 100 according to the exemplary aspect of the present disclosure will be described in more detail with reference to FIGS. 4 and 5 together.

<Planar and Cross-Sectional Structures of Active Area>

Figure 4:
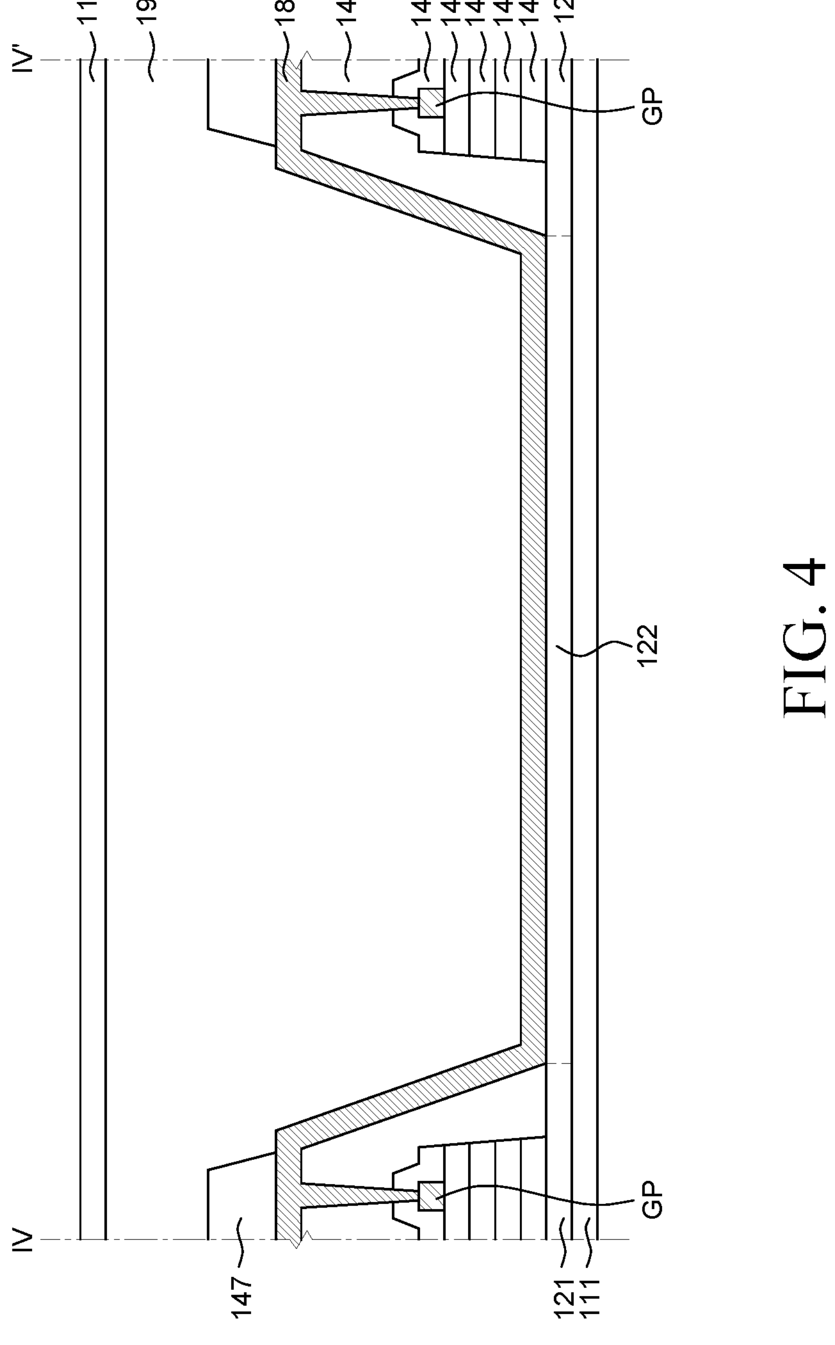
FIG. 4 is a cross-sectional view taken along line IV-IV' of FIG. 2.

FIG. 4 is a cross-sectional view taken along line IV-IV' of FIG. 2.

Figure 5:
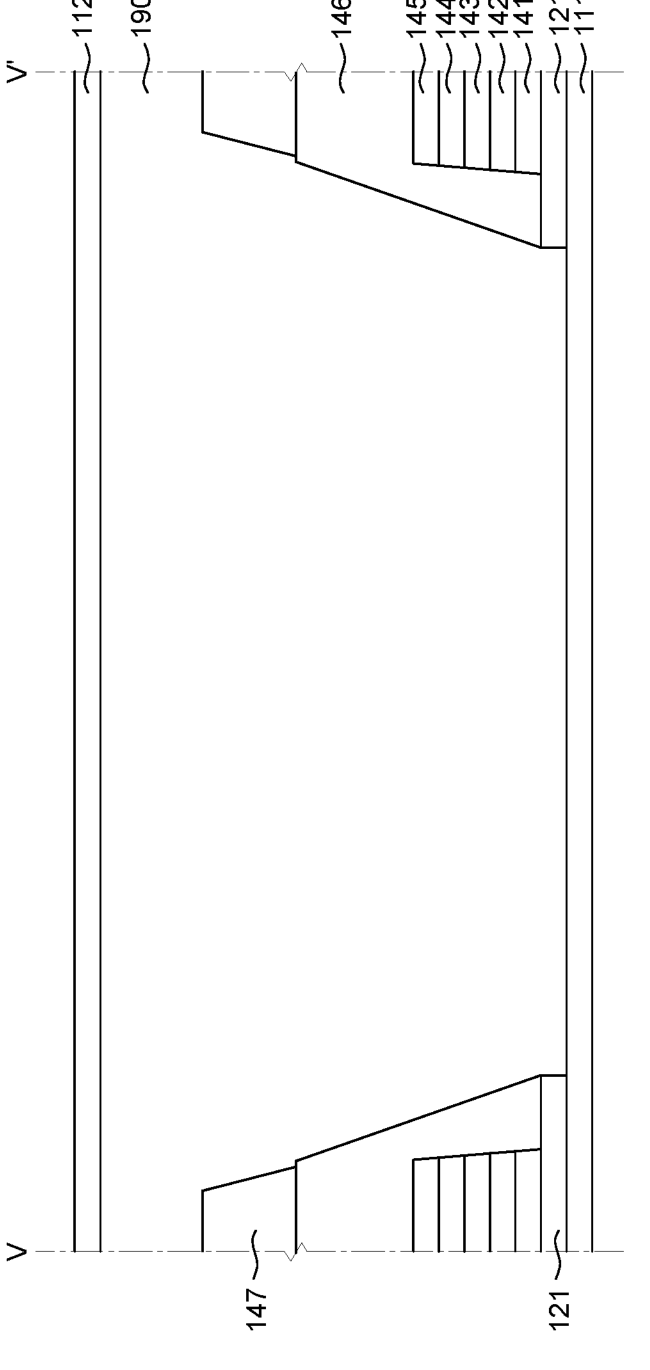
FIG. 5 is a cross-sectional view taken along line V-V' of FIG. 2.

FIG. 5 is a cross-sectional view taken along line V-V' of FIG. 2.

For the convenience of description, the description will be made with reference to FIGS. 1 to 3 together.

Referring to FIGS. 1 and 2, the plurality of pixel substrates 121 is disposed on the lower substrate 111 in the active area AA. The plurality of pixel substrates 121 is spaced apart from each other to be disposed on the lower substrate 111. For example, as illustrated in FIG. 1, the plurality of pixel substrates 121 may be disposed on the lower substrate 111 in a matrix form, but is not limited thereto.

Referring to FIGS. 2 and 3, a pixel PX including the plurality of sub pixels SPX is disposed on the pixel substrate 121. Each sub pixel SPX may include an LED 170 which is a display element and a driving transistor 160 and a switching transistor 150 which drive the LED 170. However, in the sub pixel SPX, the display element is not limited to an LED, and may be changed to an organic light emitting diode. For example, the plurality of sub pixels SPX may include a red sub pixel, a green sub pixel, and a blue sub pixel, but is not limited thereto and colors of the plurality of sub pixels SPX may be modified to various colors as needed.

The plurality of sub pixels SPX may be connected to a plurality of connection lines 181 and 182. Therefore, the plurality of connection lines 181 and 182 may include a first connection line 181 extending in the first direction X and the second connection line 182 extending in the second direction Y.

Hereinafter, a cross-sectional structure of the active area AA will be described in detail with reference to FIG. 3.

Referring to FIG. 3, a plurality of inorganic insulating layers is disposed on the plurality of pixel substrates 121. For example, the plurality of inorganic insulating layers may include a buffer layer 141, a gate insulating layer 142, a first interlayer insulating layer 143, a second interlayer insulating layer 144, and a passivation layer 145, but is not limited thereto. Therefore, on the plurality of pixel substrates 121, various inorganic insulating layers may be additionally disposed or one or more of the buffer layer 141, the gate insulating layer 142, the first interlayer insulating layer 143, the second interlayer insulating layer 144, and the passivation layer 145 may also be omitted.

Specifically, the buffer layer 141 is disposed on the plurality of pixel substrates 121. The buffer layer 141 is formed on the plurality of pixel substrates 121 to protect various components of the display device 100 from permeation of moisture ($H_2O$) and oxygen ($O_2$) from the outside of the lower substrate 111 and the plurality of pixel substrates 121. The buffer layer 141 may be configured by an insulating material. For example, the buffer layer 141 may be configured by a single layer or a double layer formed of at least one of silicon nitride (SiNx), silicon oxide (SiOx), and silicon oxynitride (SiON). However, the buffer layer 141 may be omitted depending on a structure or a characteristic of the display device 100.

In this case, the buffer layer 141 may be formed only in an area of the lower substrate 111 overlapping with the plurality of pixel substrates 121 and the plurality of circuit substrates 123. As described above, the buffer layer 141 may be formed of an inorganic material so that the buffer layer 141 may be easily cracked or damaged during a process of stretching the display device 100. In this case, the buffer layer 141 is not formed in an area between the plurality of pixel substrates 121 and the plurality of circuit substrates 123, but is patterned to have the shape of the plurality of pixel substrates 121 and the plurality of circuit substrates 123. Therefore, the buffer layer 141 may be formed only above the plurality of pixel substrates 121 and the plurality of circuit substrates 123. Therefore, in the display device 100 according to the exemplary aspect of the present disclosure, the buffer layer 141 is formed only in an area overlapping with the plurality of pixel substrates 121 and the plurality of circuit substrates 123 which are rigid patterns. Therefore, even though the display device 100 is bent or extended to be deformed, the damage of various components of the display device 100 may be suppressed.

Referring to FIG. 3, a switching transistor 150 including a gate electrode 151, an active layer 152, a source electrode 153, and a drain electrode 154 and a driving transistor 160 including a gate electrode 161, an active layer 162, a source electrode and a drain electrode 164 are formed on the buffer layer 141.

First, referring to FIG. 1, the active layer 152 of the switching transistor 150 and the active layer 162 of the driving transistor 160 are disposed on the buffer layer 141. For example, the active layer 152 of the switching transistor 150 and the active layer 162 of the driving transistor 160 may also be formed of oxide semiconductors, respectively. For example, the active layer 152 may be formed of indium-gallium-zinc oxide, indium-gallium oxide, or indium-zinc oxide. Alternatively, the active layer 152 of the switching transistor 150 and the active layer 162 of the driving transistor 160 may be formed of amorphous silicon (a-Si), polycrystalline silicon (poly-Si), or an organic semiconductor.

The gate insulating layer 142 is disposed on the active layer 152 of the switching transistor 150 and the active layer 162 of the driving transistor 160. The gate insulating layer 142 is a layer which electrically insulates the gate electrode 151 of the switching transistor 150 from the active layer 152 of the switching transistor 150 and electrically insulates the gate electrode 161 of the driving transistor 160 from the active layer 162 of the driving transistor 160. The gate insulating layer 142 may be formed of an insulating material. For example, the gate insulating layer 142 may be configured by a single layer of silicon nitride (SiNx) or silicon oxide (SiOx) which is an inorganic material or a plurality of layers of silicon nitride (SiNx) or silicon oxide (SiOx), but it is not limited thereto.

The gate electrode 151 of the switching transistor 150 and the gate electrode 161 of the driving transistor 160 are disposed on the gate insulating layer 142. The gate electrode 151 of the switching transistor 150 and the gate electrode 161 of the driving transistor 160 are disposed on the gate insulating layer 142 to be spaced apart from each other. The gate electrode 151 of the switching transistor 150 overlaps with the active layer 152 of the switching transistor 150 and the gate electrode 161 of the driving transistor 160 overlaps with the active layer 162 of the driving transistor 160.

The gate electrode 151 of the switching transistor 150 and the gate electrode 161 of the driving transistor 160 may be any one of various metal materials such as molybdenum (Mo), aluminum (Al), chrome (Cr), gold (Au), titanium (Ti), nickel (Ni), neodymium (Nd), and copper (Cu) or an alloy of two or more of them, or a plurality of layers thereof, but it is not limited thereto.

The first interlayer insulting layer 143 is disposed on the gate electrode 151 of the switching transistor 150 and the gate electrode 161 of the driving transistor 160. The first interlayer insulating layer 143 insulates the gate electrode 161 of the driving transistor 160 from an intermediate metal layer IM. The first interlayer insulating layer 143 may be formed of an inorganic material, similarly to the buffer layer 141. For example, the first interlayer insulating layer 143 may be configured by a single layer of silicon nitride (SiNx) or silicon oxide (SiOx) which is an inorganic material or a plurality of layers of silicon nitride (SiNx) or silicon oxide (SiOx), but it is not limited thereto.

The intermediate metal layer IM is disposed on the first interlayer insulating layer 143. The intermediate metal layer IM overlaps with the gate electrode 161 of the driving transistor 160. Therefore, a storage capacitor is formed in an overlapping area of the intermediate metal layer IM and the gate electrode 161 of the driving transistor 160. Specifically, the gate electrode 161 of the driving transistor 160, the first interlayer insulating layer 143, and the intermediate metal layer IM form the storage capacitor. However, the placement area of the intermediate metal layer IM is not limited thereto and the intermediate metal layer IM overlaps with the other electrode to form the storage capacitor in various forms.

The intermediate metal layer IM may be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a plurality of layers thereof, but it is not limited thereto.

The second interlayer insulating layer 144 is disposed on the intermediate metal layer IM. The second interlayer insulating layer 144 insulates the gate electrode 151 of the switching transistor 150 from the source electrode 153 and the drain electrode 154 of the switching transistor 150. The second interlayer insulating layer 144 insulates the intermediate metal layer IM from the source electrode and the drain electrode 164 of the driving transistor 160. The second interlayer insulating layer 144 may be formed of an inorganic material, similarly to the buffer layer 141. For example, the first interlayer insulating layer 143 may be configured by a single layer of silicon nitride (SiNx) or silicon oxide (SiOx) which is an inorganic material or a plurality of layers of silicon nitride (SiNx) or silicon oxide (SiOx), but it is not limited thereto.

The source electrode 153 and the drain electrode 154 of the switching transistor 150 are disposed on the second interlayer insulating layer 144. The source electrode and the drain electrode 164 of the driving transistor 160 are disposed on the second interlayer insulating layer 144. The source electrode 153 and the drain electrode 154 of the switching transistor 150 are disposed on the same layer to be spaced apart from each other. Even though in FIG. 1, the source electrode of the driving transistor 160 is omitted, the source electrode of the driving transistor 160 is also disposed to be spaced apart from the drain electrode 164 on the same layer. In the switching transistor 150, the source electrode 153 and the drain electrode 154 may be in contact with the active layer 152 to be electrically connected to the active layer 152. In the driving transistor 160, the source electrode and the drain electrode 164 may be in contact with the active layer 162 to be electrically connected to the active layer 162. The drain electrode 154 of the switching transistor 150 is in contact with the gate electrode 161 of the driving transistor 160 through a contact hole to be electrically connected to the gate electrode 161 of the driving transistor 160.

The source electrode 153 and the drain electrodes 154 and 164 may be any one of various metal materials such as molybdenum (Mo), aluminum (Al), chrome (Cr), gold (Au), titanium (Ti), nickel (Ni), neodymium (Nd), and copper (Cu) or an alloy of two or more of them, or a plurality of layers thereof, but it is not limited thereto.

Further, in this specification, even though it is described that the driving transistor 160 has a coplanar structure, various transistors such as a staggered structure may also be used. Further, in this specification, the transistor may be formed not only to have a top gate structure, but also to have a bottom gate structure.

A gate pad GP and a data pad DP may be disposed on the second interlayer insulating layer 144.

Specifically, referring to FIG. 4, the gate pad GP is a pad which transmits a gate voltage to the plurality of sub pixels SPX. The gate pad GP is connected to the first connection line 181 through a contact hole. The gate voltage supplied from the first connection line 181 may be transmitted to the gate electrode 151 of the switching transistor 150 from the gate pad GP through a wiring line formed on the pixel substrate 121.

Referring to FIG. 2, the data pad DP is a pad which transmits a data voltage to the plurality of sub pixels SPX. The data pad DP is connected to the second connection line 182 through a contact hole. The data voltage supplied from the second connection line 182 may be transmitted to the source electrode 153 of the switching transistor 150 from the data pad DP through a wiring line formed on the pixel substrate 121.

Referring to FIG. 3, the voltage pad VP is a pad which transmits a low potential voltage to the plurality of sub pixels SPX. The voltage pad VP is connected to the first connection line 181 through a contact hole. The low potential voltage supplied from the first connection line 181 may be transmitted to the n-electrode 174 of the LED 170 from the voltage pad VP through a second contact pad CNT2 formed on the pixel substrate 121.

The voltage pad VP, the gate pad GP, and the data pad DP may be formed of the same material as the source electrode 153 and the drain electrodes 154 and 164, but are not limited thereto.

Referring to FIG. 1, the passivation layer 145 is formed on the switching transistor 150 and the driving transistor 160. That is, the passivation layer 145 covers the switching transistor 150 and the driving transistor 160 to protect the switching transistor 150 and the driving transistor 160 from the permeation of moisture and oxygen. The passivation layer 145 may be formed of an inorganic material and configured by a single layer or a double layer, but is not limited thereto.

The gate insulating layer 142, the first interlayer insulating layer 143, the second interlayer insulating layer 144, and the passivation layer 145 are patterned to be formed only in an area overlapping with the plurality of pixel substrates 121. The gate insulating layer 142, the first interlayer insulating layer 143, the second interlayer insulting layer 144, and the passivation layer 145 may be also formed of the inorganic material, similar to the buffer layer 141. Therefore, the gate insulating layer 142, the first interlayer insulating layer 143, the second interlayer insulating layer 144, and the passivation layer 145 may also be easily cracked to be damaged during the process of stretching the display device 100. Therefore, the gate insulating layer 142, the first interlayer insulating layer 143, the second interlayer insulating layer 144, and the passivation layer 145 are not formed in an area between the plurality of pixel substrates 121, but are patterned to have a shape of the plurality of pixel substrates 121 to be formed only above the plurality of pixel substrates 121.

The planarization layer 146 is formed on the passivation layer 145. The planarization layer 146 planarizes upper portions of the switching transistor 150 and the driving transistor 160. The planarization layer 146 may be configured by a single layer or a plurality of layers and may be formed of an organic material. Therefore, the planarization layer 146 may also be referred to as an organic insulating layer. For example, the planarization layer 146 may be formed of an acrylic organic material, but is not limited thereto.

Referring to FIG. 3, the planarization layer 146 may be disposed to cover top surfaces and side surfaces of the buffer layer 141, the gate insulating layer 142, the first interlayer insulating layer 143, the second interlayer insulating layer 144, and the passivation layer 145 on the plurality of pixel substrates 121. The planarization layer 146 encloses the buffer layer 141, the gate insulating layer 142, the first interlayer insulating layer 143, the second interlayer insulating layer 144, and the passivation layer 145 together with the plurality of pixel substrates 121. Specifically, the planarization layer 146 may be disposed to cover a top surface and a side surface of the passivation layer 145, a side surface of the first interlayer insulating layer 143, a side surface of the second interlayer insulating layer 144, a side surface of the gate insulating layer 142, a side surface of the buffer layer 141, and a part of a top surface of the plurality of pixel substrates 121. Therefore, the planarization layer 146 may compensate for a step difference on the side surfaces of the buffer layer 141, the gate insulating layer 142, the first interlayer insulating layer 143, the second interlayer insulating layer 144, and the passivation layer 145. Further, the planarization layer 145 may enhance an adhesive strength of the planarization layer 145 and the connection lines 181 and 182 disposed on the planarization layer 146 and the side surface of the planarization layer 146.

Referring to FIG. 3, a tilt angle of the side surface of the planarization layer 146 may be smaller than a tilt angle formed by side surfaces of the buffer layer 141, the gate insulating layer 142, the first interlayer insulating layer 143, the second interlayer insulating layer 144, and the passivation layer 145. For example, the side surface of the planarization layer 146 may have a slope which is gentler than a slope formed by the side surface of the passivation layer 145, the side surface of the first interlayer insulating layer 143, the side surface of the second interlayer insulating layer 144, the side surface of the gate insulating layer 142, and the side surface of the buffer layer 141, respectively. Therefore, the connection lines 181 and 182 which are disposed to be in contact with the side surface of the planarization layer 146 are disposed with a gentle slope so that when the display device 100 is stretched, the stress generated in the connection lines 181 and 182 may be reduced. Further, the side surface of the planarization layer 146 has a relatively gentle slope so that the crack of the connection lines 181 and 182 or detachment phenomenon from the side surface of the planarization layer 146 may be suppressed.

Referring to FIGS. 2 to 4, the plurality of connection lines 181 and 182 is disposed on the plurality of connection substrates 122. The plurality of connection lines 181 and 182 refers to wiring lines which electrically connect the pads on the plurality of pixel substrates 121. As described above, the plurality of connection lines 181 and 182 disposed on the connection substrate 122 may also extend onto the plurality of pixel substrates 121 to be electrically connected to the gate pad GP and the data pad DP on the plurality of pixel substrates 121. Referring to FIG. 1, the connection substrate 122 is not disposed in an area where the connection lines 181 and 182 are not disposed, among areas between the plurality of pixel substrates 121.

The connection lines 181 and 182 may be formed of a metal material such as copper (Cu), aluminum (Al), titanium (Ti), and molybdenum (Mo) or a stacked structure of metal materials such as copper/molybdenum-titanium (Cu/Moti) and titanium/aluminum/titanium (Ti/Al/Ti), but is not limited thereto.

In the case of a display panel of a general display device, various wiring lines such as a plurality of gate lines and a plurality of data lines extend between the plurality of sub pixels as a straight line and the plurality of sub pixels is connected to one signal line. Therefore, in the display panel of the general display device, various wiring lines, such as a gate line, a data line, a high potential voltage line, and a reference voltage line, extend from one side to the other side of the display panel of the organic light emitting display device without being disconnected on the substrate.

In contrast, in the display device 100 according to the exemplary aspect of the present disclosure, various wiring lines, such as a gate line, a data line, a high potential voltage line, a reference voltage line, and an initialization voltage line having a straight line shape which are considered to be used for the display panel of the general organic light emitting display device, is disposed only on the plurality of pixel substrates 121 and the plurality of circuit substrates 123. That is, in the display device 100 according to the exemplary aspect of the present disclosure, a straight wiring line is disposed only on the plurality of pixel substrates 121 and the plurality of circuit substrates 123.

In the display device 100 according to the exemplary aspect of the present disclosure, the pads on the two adjacent pixel substrates 121 may be connected by the connection lines 181 and 182. Accordingly, the connection lines 181 and 182 electrically connect the gate pads GP or the data pads DP on two adjacent pixel substrates 121. Accordingly, the display device 100 according to the exemplary aspect of the present disclosure may include a plurality of connection lines 181 and 182 to electrically connect various wiring lines, such as a gate line, a data line, a high potential voltage line, and a reference voltage line, between the plurality of pixel substrates 121. For example, the gate line may be disposed on the plurality of pixel substrates 121 disposed to be adjacent to each other in the first direction X and the gate pad GP may be disposed on both ends of the gate line. In this case, the plurality of gate pads GP on the plurality of pixel substrates 121 adjacent to each other in the first direction X may be connected to each other by the first connection line 181 which serves as a gate line. Therefore, the gate line disposed on the plurality of pixel substrates 121 and the first connection line 181 disposed on the circuit substrate 123 may serve as one gate line. The gate line may be referred to as a scan signal line. Further, wiring lines which extend in the first direction X, among all various wiring lines which may be included in the display device 100, such as an emission signal line, a low potential voltage line, and a high potential voltage line, may also be electrically connected by the first connection line 181, as described above.

Referring to FIGS. 2 and 4, the first connection line 181 may connect the gate pads GP on two pixel substrates 121 which are disposed side by side, among the gate pads GP on the plurality of pixel substrates 121 disposed to be adjacent in the first direction X. The first connection line 181 may serve as a gate line, an emission signal line, a high potential voltage line, or a low potential voltage line, but is not limited thereto. For example, the first connection line 181 may serve as a gate line and electrically connect the gate pads GP on two pixel substrates 121 which are disposed side by side in the first direction X. Therefore, as described above, the gate pads GP on the plurality of pixel substrates 121 disposed in the first direction X may be connected by the first connection line 181 serving as a gate line and transmit one gate signal.

Referring to FIG. 2, the second connection line 182 may connect the data pads DP on two pixel substrates 121 which are disposed side by side, among the data pads DP on the plurality of pixel substrates 121 disposed to be adjacent in the second direction Y. The second connection line 182 may serve as a data line, a high potential voltage line, a low potential voltage line, or a reference voltage line, but is not limited thereto. For example, the second connection line 182 may serve as a data line and electrically connect the data line on two pixel substrates 121 which are disposed side by side in the second direction Y. Therefore, as described above, the internal line on the plurality of pixel substrates 121 disposed in the second direction Y may be connected by the plurality of second connection lines 182 serving as a data line and transmit one data voltage.

As illustrated in FIG. 4, the first connection line 181 may be formed to extend to a top surface of the connection substrate 122 while being in contact with a top surface and a side surface of the planarization layer 146 disposed on the pixel substrate 121. Further, as illustrated in FIG. 1, the second connection line 182 may be formed to extend to a top surface of the connection substrate 122 while being in contact with a top surface and a side surface of the planarization layer 146 disposed on the pixel substrate 121.

However, as illustrated in FIG. 5, there is no need to dispose a rigid pattern in an area where the first connection line 181 and the second connection line 182 are not disposed. Therefore, the connection substrate 122 which is a rigid pattern is not disposed below the first connection line 181 and the second connection line 182.

In the meantime, referring to FIG. 3, a bank 147 is formed on the first connection pad CNT1, the connection lines 181 and 182, and the planarization layer 146. The bank 147 is a component which divides adjacent sub pixels SPX. The bank 147 is disposed to cover at least a part of the pad PD, the connection lines 181 and 182, and the planarization layer 146. The bank 147 may be formed of an insulating material. Further, the bank 147 may include a black material. The bank 147 includes the black material to block wiring lines which may be visible through the active area AA. For example, the bank 147 may be formed of a transparent carbon based mixture and specifically, include carbon black. However, it is not limited thereto and the bank 147 may also be formed of a transparent insulating material. Even though in FIG. 1, it is illustrated that a height of the bank 147 is lower than a height of the LED 170, the present disclosure is not limited thereto and the height of the bank 147 may be equal to the height of the LED 170.

Referring to FIG. 3, an LED 170 is disposed on the first connection pad CNT1 and the second connection pad CNT2. The LED 170 includes an n-type layer 171, an active layer 172, a p-type layer 173, an n-electrode 174, and a p-electrode 175. The LED 170 of the display device 100 according to the exemplary aspect of the present disclosure has a flip-chip structure in which the n-electrode 174 and the p-electrode 175 are formed on one surface.

The n-type layer 171 may be formed by injecting an n-type impurity into gallium nitride (GaN) having excellent crystallinity. The n-type layer 171 may also be disposed on a separate base substrate which is formed of a material which is capable of emitting light.

The active layer 172 is disposed on the n-type layer 171. The active layer 172 is a light emitting layer which emits light in the LED 170 and may be formed of a nitride semiconductor, for example, indium gallium nitride (InGaN). The p-type layer 173 is disposed on the active layer 172. The p-type layer 173 may be formed by injecting a p-type impurity into gallium nitride (GaN).

As described above, the LED 170 according to the exemplary aspect of the present disclosure is manufactured by sequentially laminating the n-type layer 171, the active layer 172, and the p-type layer 173, and then etching a predetermined part to form the n-electrode 174 and the p-electrode 175. In this case, the predetermined part is a space for separating the n-electrode 174 and the p-electrode 175, and etched to expose a part of the n-type layer 171. In other words, the surfaces of the LED 170 on which the n-electrode 174 and the p-electrode 175 are disposed are not flat surfaces, but have different heights from each other.

As described above, the n-electrode 174 is disposed in the etched area and may be formed of a conductive material. The p-electrode 175 is disposed in an area which is not etched and the p-electrode 175 may also be formed of a conductive material. For example, the n-electrode 174 is disposed on the n-type layer 171 which is exposed by the etching process and the p-electrode 175 is disposed on the p-type layer 173. The p-electrode 175 may be formed of the same material as the n-electrode 174.

An adhesive layer AD is disposed on top surfaces of the first connection pad CNT1 and the second connection pad CNT2 and between the first connection pad CNT1 and the second connection pad CNT2 so that the LED 170 may be bonded onto the first connection pad CNT1 and the second connection pad CNT2. In this case, the n-electrode 174 may be disposed on the second connection pad CNT2 and the p-electrode 175 may be disposed on the first connection pad CNT1.

The adhesive layer AD may be a conductive adhesive layer in which conductive balls are dispersed in an insulating base member. Therefore, when heat or a pressure is applied to the adhesive layer AD, the conductive balls are electrically connected in a portion applied with the heat or pressure to have a conductive property and an area which is not pressurized may have an insulation property. For example, the n-electrode 174 is electrically connected to the second connection pad CNT2 by means of the adhesive layer AD and the p-electrode 175 is electrically connected to the first connection pad CNT1 by means of the adhesive layer AD. That is, after applying the adhesive layer AD on the top surface of the second connection pad CNT2 and the first connection pad CNT1 using an inkjet method, the LED 170 is transferred onto the adhesive layer AD and the LED 170 is pressurized and heated. By doing this, the first connection pad CNT1 may be electrically connected to the p-electrode 175 and the second connection pad CNT2 may be electrically connected to the n-electrode 174. However, the remaining part of the adhesive layer AD excluding a part of the adhesive layer AD disposed between the n-electrode 174 and the second connection pad CNT2 and a part of the adhesive layer AD disposed between the p-electrode 175 and the first connection pad CNT1 have an insulating property. In the meantime, the adhesive layer AD may be divided to be disposed on the first connection pad CNT1 and the second connection pad CNT2, respectively.

The first connection pad CNT1 is electrically connected to the drain electrode 164 of the driving transistor 160 to be applied with a driving voltage from the driving transistor 160 to drive the LED 170. Even though in FIG. 3, it is illustrated that the first connection pad CNT1 is not in direct contact with the drain electrode 164 of the driving transistor 160, but is in indirect contact therewith, the present disclosure is not limited thereto. Therefore, the first connection pad CNT1 and the drain electrode 164 of the driving transistor 160 may be in direct contact with each other. Further, a low potential driving voltage is applied to the second connection pad CNT2 to drive the LED 170. Therefore, when the display device 100 is turned on, different voltage levels applied to each of the first connection pad CNT1 and the second connection pad CNT2 are transmitted to the n-electrode 174 and the p-electrode 175 so that the LED 170 emits light.

The upper substrate 112 is a substrate which supports various components disposed below the upper substrate 112. Specifically, the upper substrate 112 may be formed by coating and curing a material which configures the upper substrate 112 on the lower substrate 111 and the pixel substrate 121. The upper substrate 112 may be disposed to be in contact with the lower substrate 111, the pixel substrate 121, the connection substrate 122, and the connection lines 181 and 182.

The upper substrate 112 may be formed of the same material as the lower substrate 111. For example, the upper substrate 112 may be formed of a silicon rubber such as polydimethylsiloxane (PDMS) or an elastomer such as polyurethane (PU) or polytetrafluoroethylene (PTFE) and thus have a flexible property. However, the material of the upper substrate 112 is not limited thereto.

Even though not illustrated in FIG. 3, a polarization layer may be disposed on the upper substrate 112. The polarization layer may perform a function which polarizes light incident from the outside of the display device 100 to reduce the external light reflection. Further, an optical film other than the polarization layer may be disposed on the upper substrate 112.

The filling layer 190 may be disposed on the entire surface of the lower substrate 111 to be filled between the components disposed on the upper substrate 112 and the lower substrate 111. The filling layer 190 may be configured by a curable adhesive. Specifically, the material which configures the filling layer 190 is coated on the entire surface of the lower substrate 111 and then is hardened so that the filling layer 190 may be disposed between the components disposed on the upper substrate 112 and the lower substrate 111. For example, the filling layer 190 may be an optically clear adhesive (OCA) and may be configured by an acrylic adhesive, a silicon based adhesive, and a urethane based adhesive.

<Circuit Structure and Driving Method of Active Area>

Figure 6:
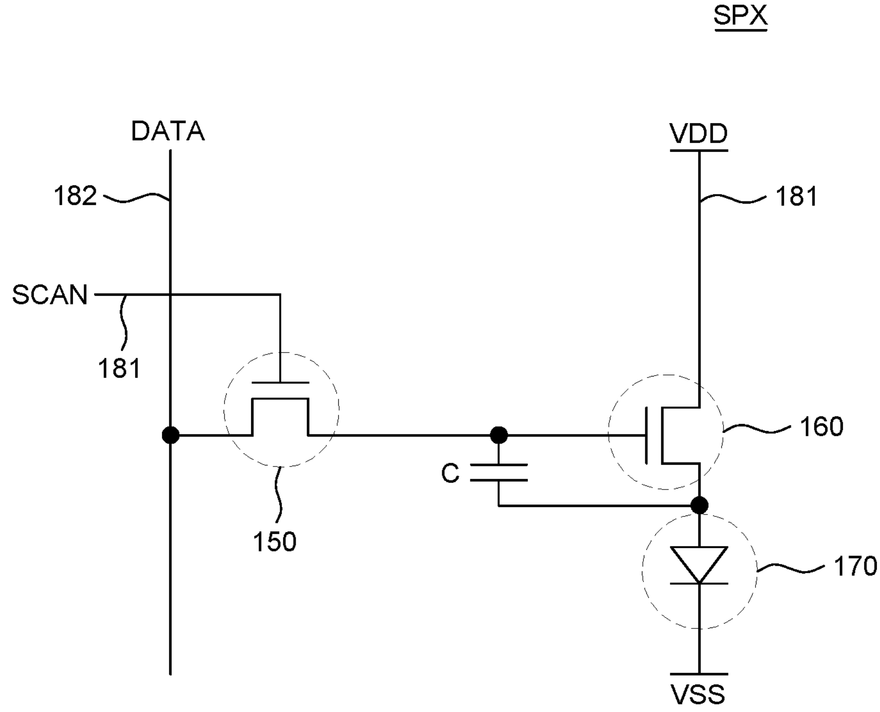
FIG. 6 is a circuit diagram of a sub pixel of a display device according to an exemplary aspect of the present disclosure.

FIG. 6 is a circuit diagram of a sub pixel of a display device according to an exemplary aspect of the present disclosure.

Hereinafter, for the convenience of description, a structure and an operation when a sub pixel SPX of a display device 100 according to the exemplary aspect of the present disclosure is a pixel circuit with 2T (transistor) 1C (capacitor) will be described, but the present disclosure is not limited thereto.

Referring to FIGS. 3 and 6, a sub pixel SPX of the display device 100 according to the exemplary aspect of the present disclosure may be configured to include a switching transistor 150, a driving transistor 160, a storage capacitor C, and an LED 170.

The switching transistor 150 applies a data signal DATA supplied through the second connection line 182 to the driving transistor 160 and the storage capacitor C in accordance with a gate signal SCAN supplied through the first connection line 181.

A gate electrode 151 of the switching transistor 150 is electrically connected to the first connection line 181, a source electrode 153 of the switching transistor 150 is connected to the second connection line 182, and a drain electrode 154 of the switching transistor 150 is connected to the gate electrode 161 of the driving transistor 160.

The driving transistor 160 may operate to allow a driving current in accordance with the high potential power VDD supplied through the first connection line 181 and the data voltage DATA to flow in response to the data voltage DATA stored in the storage capacitor C.

A gate electrode 161 of the driving transistor 160 is electrically connected to the drain electrode 154 of the switching transistor 150, a source electrode of the driving transistor 160 is connected to the first connection line 181, and a drain electrode 164 of the driving transistor 160 is connected to the LED 170.

The LED 170 may operate to emit light in accordance with a driving current formed by the driving transistor 160. As described above, the n-electrode 174 of the LED 170 is connected to the first pixel connection line 181 to be applied with the low potential power VSS. The p-electrode 174 of the LED 170 is connected to the drain electrode 164 of the driving transistor 160 to be applied with a driving voltage corresponding to the driving current.

As described above, the sub pixel SPX of the display device 100 according to the exemplary aspect of the present disclosure is configured by a 2T1C structure including the switching transistor 150, the driving transistor 160, the storage capacitor C, and the LED 170. However, when a compensation circuit is added, the sub pixel may be configured in various ways, such as 3T1C, 4T2C, 5T2C, 6T1C, 6T2C, 7T1C, and 7T2C.

As described above, the display device 100 according to the exemplary aspect of the present disclosure may include a plurality of sub pixels on a first substrate which is rigid substrate and each of the plurality of sub pixels SPX may include a switching transistor, a driving transistor, a storage capacitor, and an LED.

Accordingly, the display device 100 according to the exemplary aspect of the present disclosure may not only be stretched by the lower substrate 111, but also include a pixel circuit with a 2T1C structure on each first substrate to emit light according to the data voltage in accordance with each gate timing.

Hereinafter, the connection substrate 122 of the display device 100 according to an exemplary aspect of the present disclosure will be described in more detail with reference to FIGS. 7 and 8.

<Shape of Connection Line>

Figure 7:
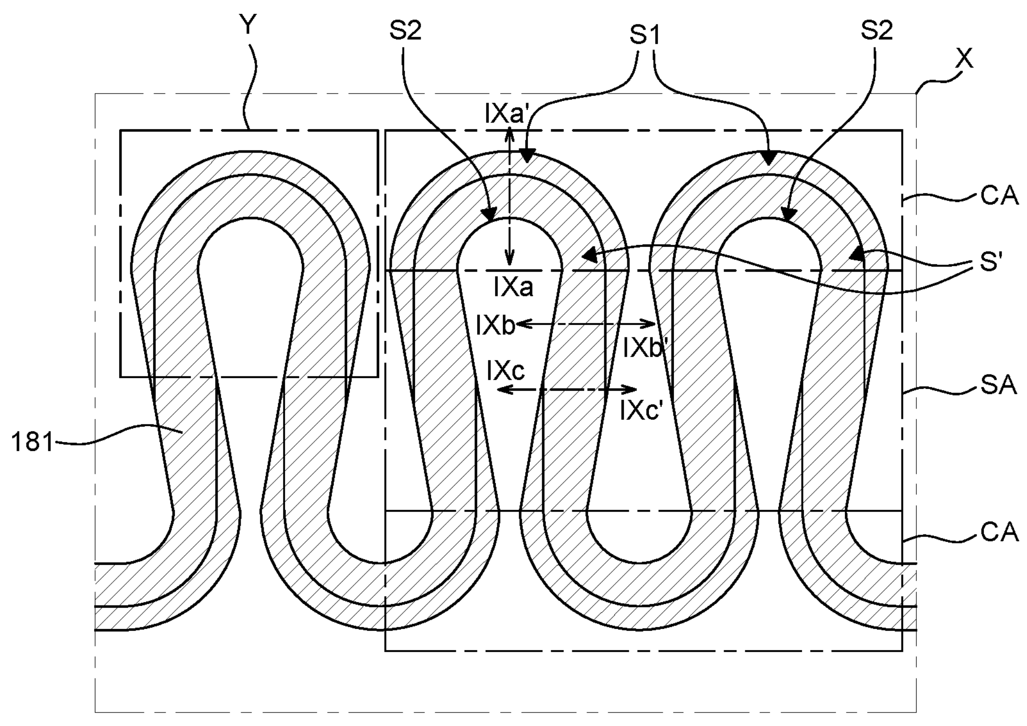
FIG. 7 is an enlarged plan view of an area in which a connection substrate of a display device is disposed according to an exemplary aspect of the present disclosure.

FIG. 7 is an enlarged plan view of an area in which a connection substrate of a display device is disposed according to an exemplary aspect of the present disclosure. FIG. 8 is an enlarged perspective view of an area in which a connection substrate of a display device is disposed according to an exemplary aspect of the present disclosure. FIG. 7 is an enlarged plan view of an area X of FIG. 2 and FIG. 8 is an enlarged perspective view of an area Y of FIG. 7. In FIGS. 7 and 8, for the convenience of description, among various components of the display device 100, only a connection substrate 122 and a first connection line 181 are illustrated. In FIGS. 7 to 8, only the first connection line 181 between the connection lines 181 and 182 is illustrated for the sake of convenience, but the second connection line 182 may also have the same structure as the first connection line 181.

Referring to FIG. 7, each of a plurality of connection substrates 122 and a plurality of first connection lines 181 have wavy shapes. As described above, each of the plurality of connection substrates 122 and the plurality of first connection lines 181 may have various shapes such as a sine wave shape or a zigzag pattern.

Therefore, the plurality of connection substrates 122 may include a plurality of straight areas SA and a plurality of curved areas CA. Therefore, an area in which the plurality of connection substrates 122 is disposed may be divided into the plurality of straight areas SA and the plurality of curved areas CA.

First, in the curved area CA, the plurality of connection substrates 122 may be bent with a predetermined curvature without extending in a straight line. However, in FIG. 7, it is illustrated that the plurality of connection substrates 122 is bent in the curved area CA while maintaining a predetermined curvature. However, the present disclosure is not limited thereto and depending on the necessity for a design, the plurality of connection substrates 122 may be bent in the curved area CA while maintaining a variable curvature or curved at a predetermined angle.

Figure 8:
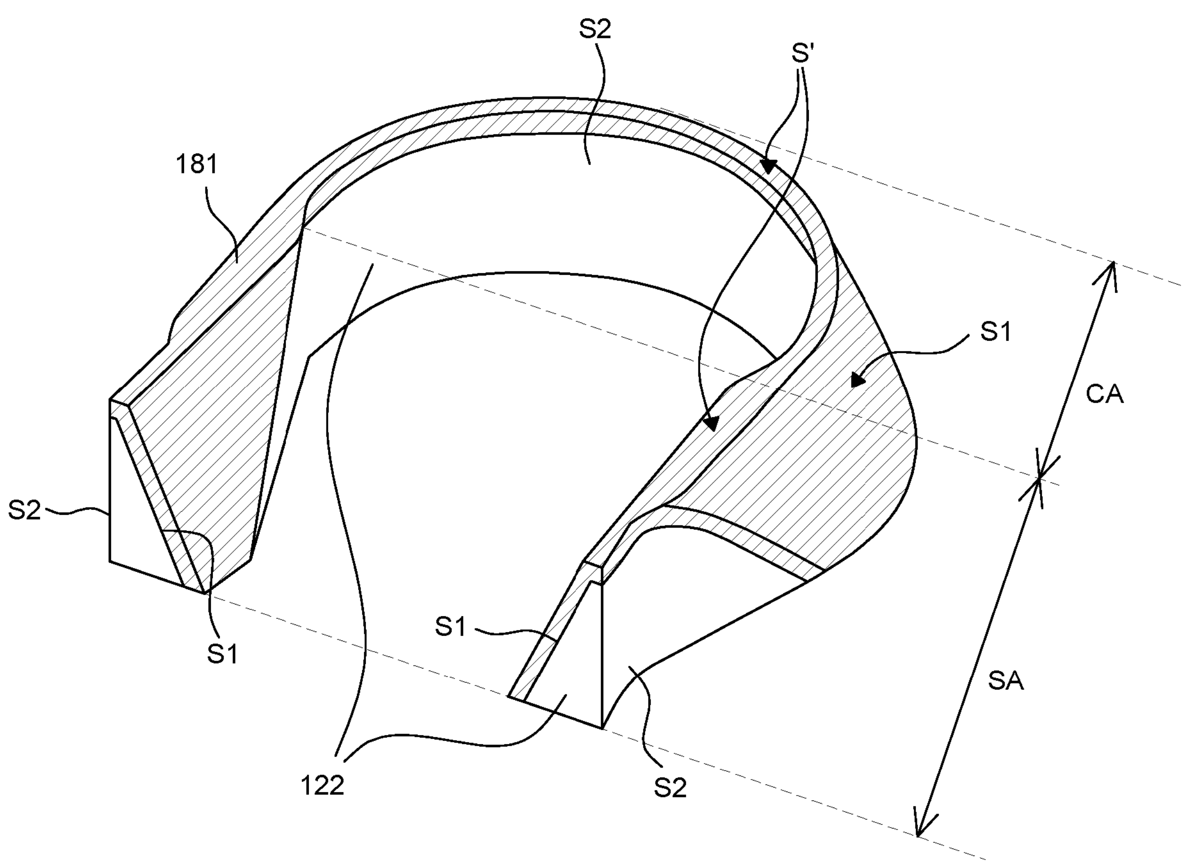
FIG. 8 is an enlarged perspective view of an area in which a connection substrate of a display device is disposed according to an exemplary aspect of the present disclosure.

Referring to FIGS. 7 and 8, in the curved area CA, the connection substrate 122 may include a top surface S' of the connection substrate 122 and a first side surface S1 and a second side surface S2 extending from the top surface S' of the connection substrate 122.

The top surface S' of the connection substrate 122 may be disposed with a flat shape. The top surface S' of the connection substrate 122 and the bottom surface of the connection substrate 122 may be parallel to each other. At this time, a width of the top surface S' of the connection substrate 122 may be smaller than a width of the bottom surface. Further, referring to FIG. 8, in the curved area CA, the top surface S' of the connection substrate 122 does not vary according to the position, but may be disposed with the same width.

In the curved area CA, the first side surface S1 which is formed as an inclined surface with respect to the top surface S' of the connection substrate 122 may be disposed on an outer peripheral surface of the connection substrate 122. Further, in the curved area CA, the second side surface S2 having a tilt angle different from that of the first side surface S1 may be disposed on an inner peripheral surface of the connection substrate 122. For example, the second side surface S2 may be disposed to be perpendicular to the bottom surface of the connection substrate 122.

Next, referring to FIGS. 7 and 8, the connection substrate 122 may include a straight area SA. The straight area SA may be straightly disposed between the plurality of curved areas CA without being bent.

In the straight area SA, the connection substrate 122 may include a top surface S' of the connection substrate 122 and a first side surface S1 and a second side surface S2 extending from the top surface S' of the connection substrate 122. At this time, the first side surface S1 of the straight area SA may be a surface extending from the first side surface S1 of the curved area CA and the second side surface S2 of the straight area SA may be a surface extending from the second side surface S2 of the curved area CA.

In the straight area SA, a width of the top surface S' of the connection substrate 122 may be smaller than a width of the bottom surface. Further, referring to FIG. 8, in the straight area SA, the top surface S' of the connection substrate 122 may be disposed with a width which varies according to the position.

The first side surface S1 of the straight area SA may be disposed on an outer peripheral surface of the connection substrate 122 to be disposed as a tilt surface with respect to the top surface S' of the connection substrate 122. Further, in the straight area SA, the second side surface S2 may be disposed on the inner peripheral surface of the connection substrate 122 and may have a tilt angle different from that of the first side surface S1. For example, the second side surface S2 may be disposed to be perpendicular to the bottom surface of the connection substrate 122.

In the straight area SA, the connection substrate 122 may be disposed diagonally with respect to the side surface of the pixel substrate 121. At this time, in the straight area SA, the first side surface S1 may be disposed only in an area adjacent to the outer peripheral surface, between the inner peripheral surface and the outer peripheral surface of the curved area CA.

Hereinafter, a display device and a manufacturing process of a display device according to an exemplary aspect of the present disclosure will be described with reference to FIGS. 10A to 10G.

Figure 10A:
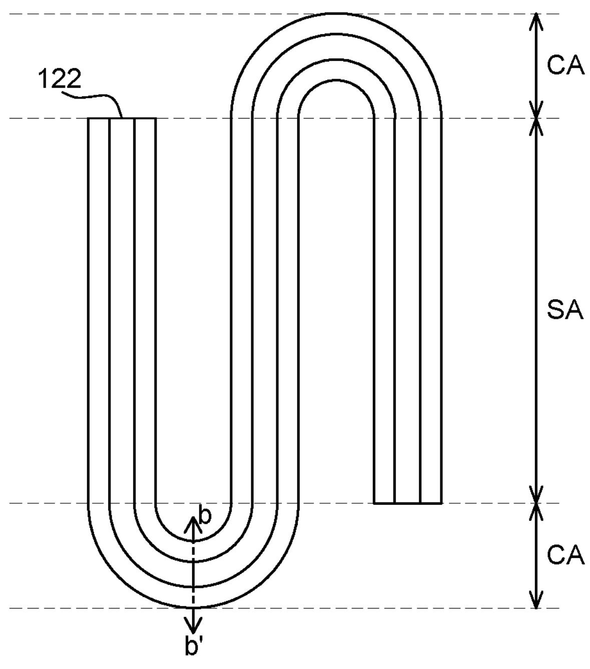
FIGS. 10A to 10H are schematic diagrams for explaining a manufacturing process of a display device according to an exemplary aspect of the present disclosure.
Figure 10B:
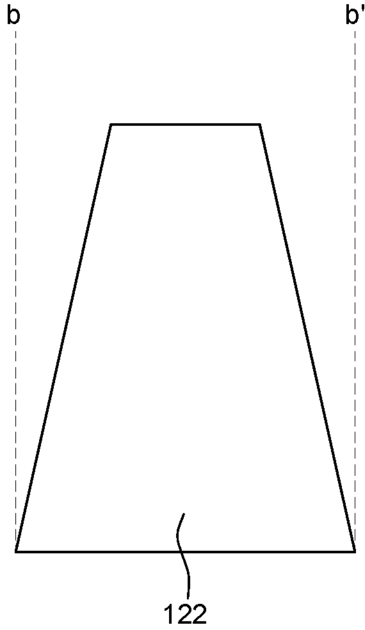
Figure 10C:
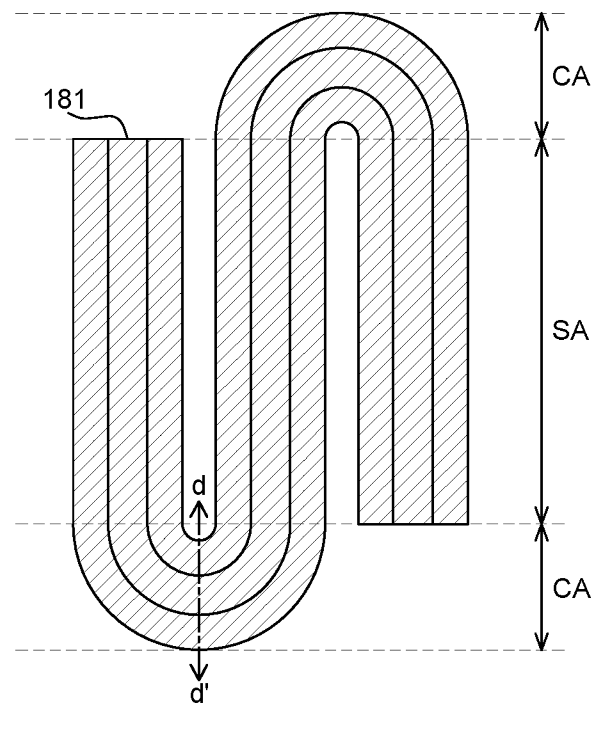
Figure 10D:
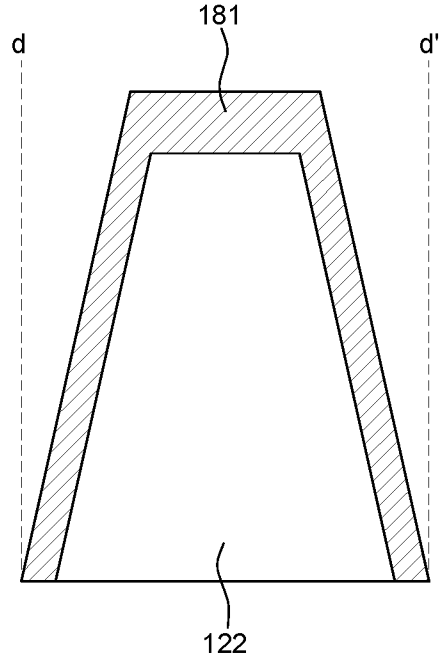
Figure 10E:
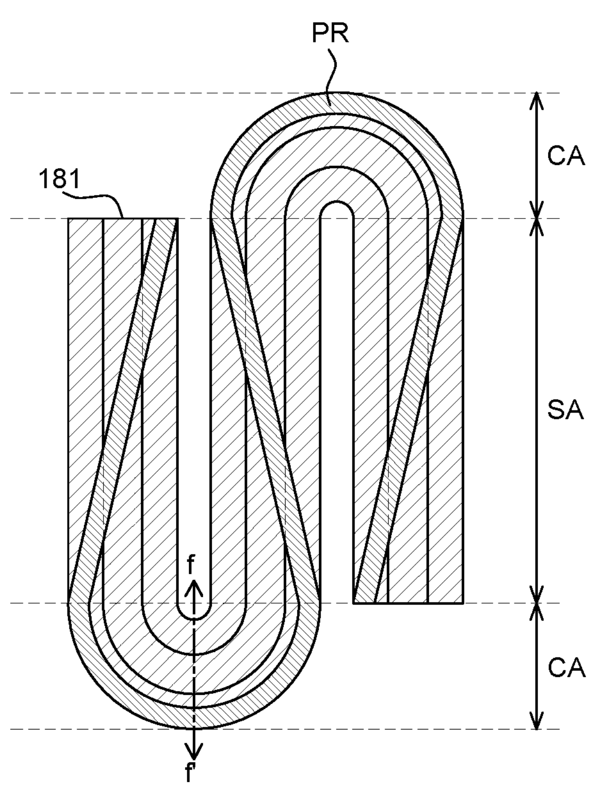
Figure 10F:
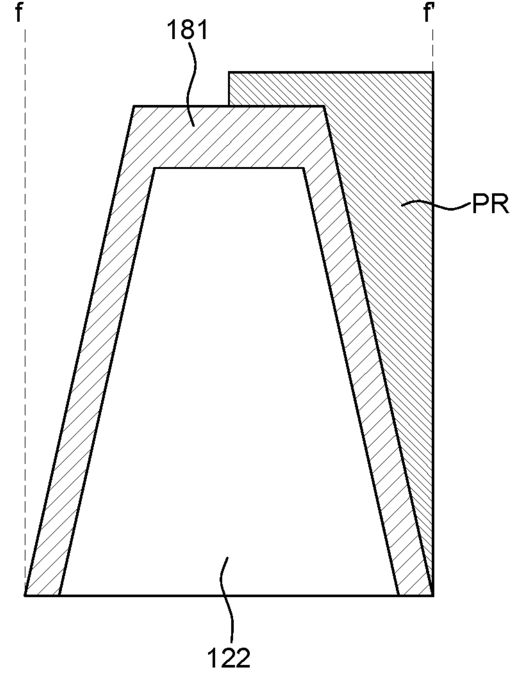
Figure 10G:
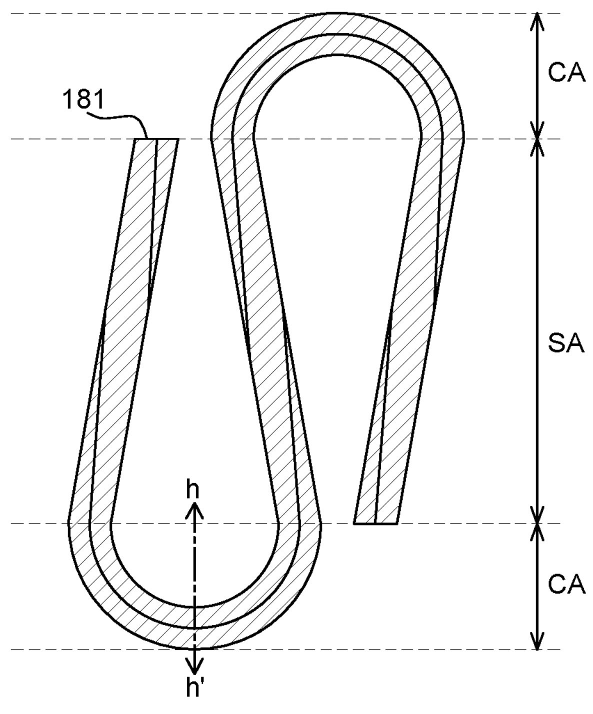
Figure 10H:
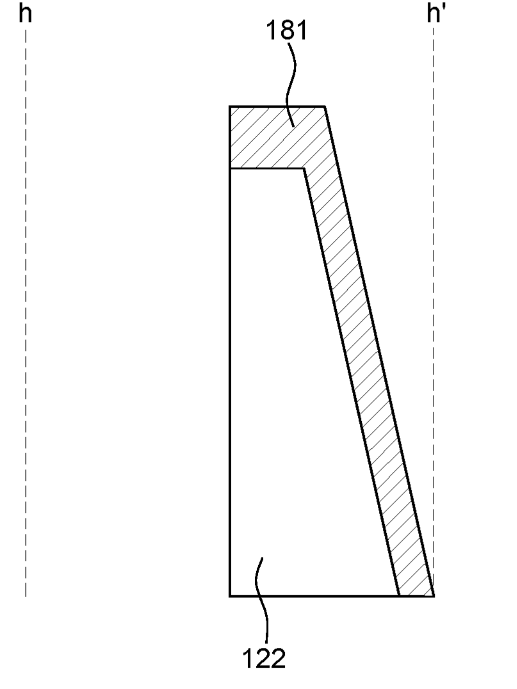

FIGS. 10A to 10H are schematic diagrams for explaining a manufacturing process of a display device according to an exemplary aspect of the present disclosure. FIG. 10B is a cross-sectional view taken along line b-b' illustrated in FIG. 10A, FIG. 10D is a cross-sectional view taken along line d-d' illustrated in FIG. 10C, FIG. 10F is a cross-sectional view taken along line f-f' illustrated in FIG. 10E, and FIG. 10H is a cross-sectional view taken along line h-h' illustrated in FIG. 10G. In FIGS. 10A to 10H, for the convenience of description, among various configurations of the display device 100, only a connection substrate 122 and a first connection line 181 are illustrated.

First, referring to FIGS. 10A and 10B, the connection substrate 122 is disposed on the lower substrate 111. The connection substrate 122 may be formed on the lower substrate 111 to include a curved area CA and a straight area SA. At this time, in the straight area SA, the connection substrates 122 may be disposed to be parallel to each other. That is, in the straight area SA, the connection substrates 122 may be disposed to be aligned in one direction. Both side surfaces of the connection substrate 122 may be formed to form a tilt angle with respect to the top surface S' of the connection substrate 122. At this time, both side surfaces of the connection substrate 122 may be formed as tilt surfaces having the same tilt angle. A cross-sectional shape of the connection substrate 122 may have a trapezoidal shape as illustrated in FIG. 10B. Even though in FIG. 10B, a cross-sectional shape of the connection substrate 122 in the curved area CA has been illustrated, the cross-sectional shape of the connection substrate 122 in the straight area SA may be also the same as illustrated in FIG. 10B.

Next, referring to FIGS. 10C and 10D, the first connection line 182 is formed on the connection substrate 122. Referring to FIG. 10C, the first connection line 181 is disposed on the connection substrate 122 to cover the top surface S' and both side surfaces of the connection substrate 122. Accordingly, as illustrated in FIG. 10D, the first connection line 181 may be disposed in accordance with shapes of the top surface and the side surfaces of the connection substrate 122. Even though in FIG. 10D, cross-sectional shapes of the connection substrate 122 and the first connection line 181 in the curved area CA have been described, the cross-sectional shapes of the connection substrate 122 and the first connection line 181 in the straight area SA may be also the same as illustrated in FIG. 10D.

Next, referring to FIGS. 10E and 10F, a photoresist PR is disposed in an area of the first connection line 181 and the connection substrate 122 excluding an area to be removed. That is, the photoresist PR is disposed on an area of the first connection line 181 and the connection substrate 122 to be remained. In the curved area CA, the inside of the first connection line 181 and the connection substrate 122 is removed so that the photoresist PR may be disposed to be adjacent to the outer peripheral surface of the curved area CA. In the straight area SA, the photoresist PR is straightly disposed to connect the photoresist PR disposed in the curved area CA. Therefore, in the straight area SA, the photoresist PR may be diagonally disposed.

Therefore, referring to FIG. 10E, in the straight area SA, both side surfaces corresponding to a side surface extending from an inner side surface of the curved area CA and a side surface extending from an outer side surface are removed. However, both side surfaces are not removed at the same ratio, but both side surfaces may be designed at different rates so that the connection substrate 122 is diagonally disposed in the straight area SA. For example, both side surfaces are removed at the center portion of the straight area SA by the same amount, but as they are closer to the curved area CA, the deviation of the area removed from both side surfaces is increased. Therefore, both side surfaces are uniformly removed in the center portion of the straight area SA so that the top surface S' of the connection substrate 122 may have a maximum width. Further, in the area adjacent to the curved area CA, one side surface is removed relatively more so that the top surface S' of the connection substrate 122 may have a minimum width.

Next, referring to FIG. 10G, the connection substrate 122 and the first connection line 181 which are not covered by the photoresist PR are removed by the etching process and the photoresist PR is removed. Therefore, it is confirmed that the connection substrate 122 and the first connection line 181 include a curved area CA and the straight area SA and in the straight area SA, the connection substrate 122 and the first connection line 181 are diagonally formed.

In FIG. 10H, cross-sectional shapes of the connection substrate 122 and the first connection line 181 in the curved area CA are illustrated. Referring to FIG. 10H, it may be confirmed that the connection substrate 122 includes a first side surface S1 which forms a tilt angle with respect to the bottom surface of the connection substrate 122 and a second side surface S2 which is perpendicular to the bottom surface of the connection substrate 122. Further, it may be confirmed that the first connection line 181 is disposed on the top surface S' and the first side surface S1 of the connection substrate 122.

Hereinafter, a shape of the connection substrate 122 of the display device 100 according to the exemplary aspect of the present disclosure in the straight area SA and the curved area CA will be described in more detail with reference to FIGS. 9A to 9C.

Figure 9A:
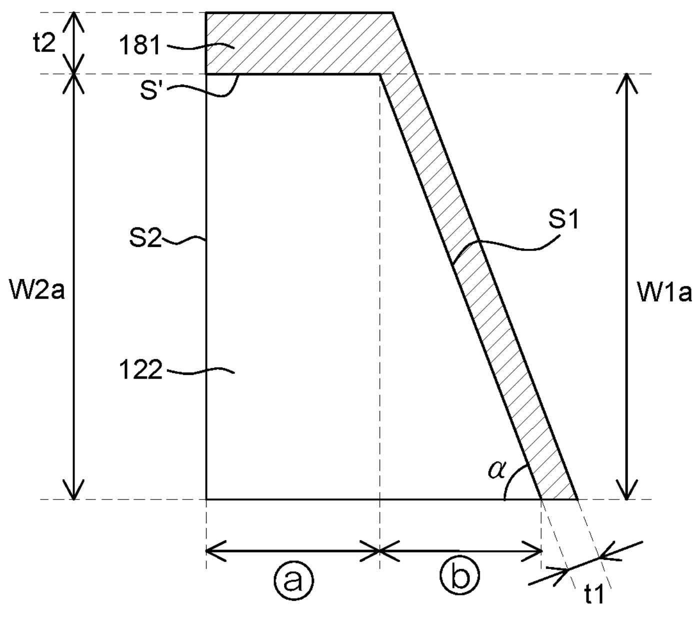
FIG. 9A is a cross-sectional view taken along line IXa-IXa' of FIG. 7.

FIG. 9A is a cross-sectional view taken along line IXa-IXa' of FIG. 7. FIG. 9B is a cross-sectional view taken along line IXb-IXb' of FIG. 7. FIG. 9C is a cross-sectional view taken along line IXc-IXc' of FIG. 7. FIG. 9A is a cross-sectional view of the curved area CA and FIGS. 9B and 9C are cross-sectional views of the straight area CA. FIG. 9B is a cross-sectional view of an area adjacent to the curved area CA and FIG. 9C is a cross-sectional view of an area which is spaced apart from the curved area CA. Even though in FIGS. 9A to 9C, only the first connection line 181 between the connection lines 181 and 182 is illustrated for the sake of convenience, the second connection line 182 may also have the same structure as the first connection line 181.

Referring to FIG. 9A, a width of the top surface S' of the connection substrate 122 in the straight area SA may be different from a width of the top surface S' of the connection substrate in the curved area CA. For example, the width of the top surface S' of the connection substrate 122 in the straight area SA may larger than width of the top surface S' of the connection substrate in the curved area CA.

The first side surface S1 may be disposed on an outer peripheral surface of the connection substrate 122. The first side surface S1 may be disposed as a tilt surface with respect to the top surface S' of the connection substrate 122. Therefore, the first side surface S1 may be disposed as a tilt surface with respect to the bottom surface of the connection substrate 122.

The second side surface S2 may be disposed on an inner peripheral surface of the connection substrate 122. The second side surface S2 of the connection substrate 122 may be disposed to have a different tilt angle from that of the first side surface S1 of the connection substrate 122. For example, the tilt angle of the second side surface S2 may be perpendicular to the bottom surface and the top surface S' of the connection substrate 122. Therefore, the tilt angle of the first side surface S1 may be smaller than the tilt angle of the second side surface S2.

Figure 9B:
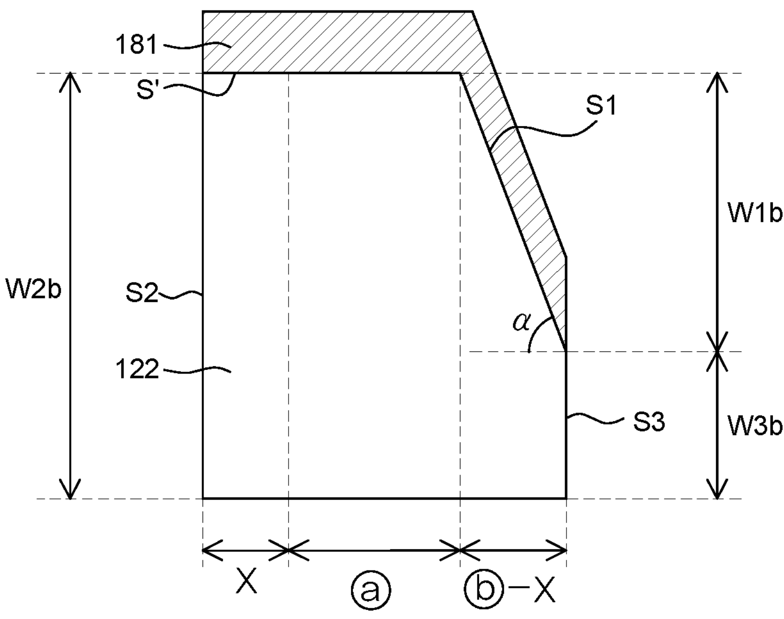
FIG. 9B is a cross-sectional view taken along line IXb-IXb' of FIG. 7.
Figure 9C:
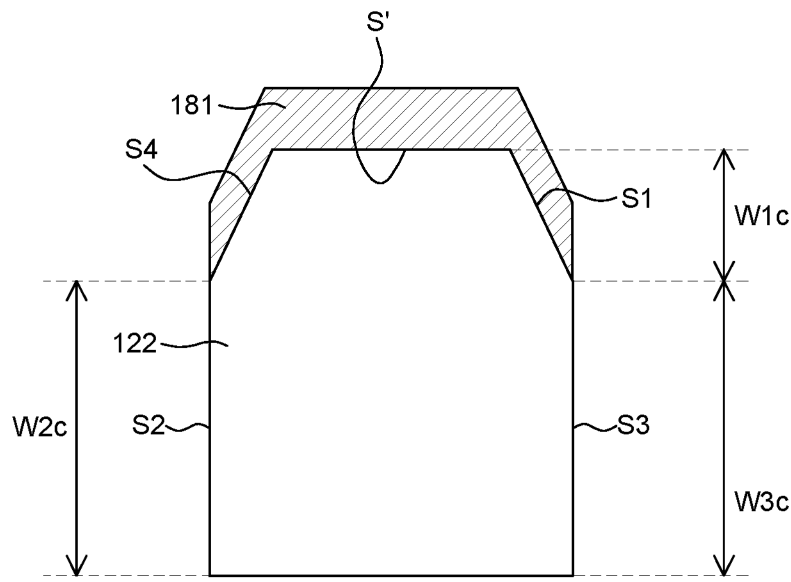
FIG. 9C is a cross-sectional view taken along line IXc-IXc' of FIG. 7.

Referring to FIGS. 9A and 9C, a width of the top surface S' of the connection substrate 122 in the straight area SA may be different from a width of the top surface S' of the connection substrate in the curved area CA. For example, the width of the top surface S' of the connection substrate 122 in the straight area SA may larger than width of the top surface S' of the connection substrate in the curved area CA.

In the meantime, in the straight area SA, a width of the top surface S' of the connection substrate 122 may vary depending on the position. Referring to FIG. 8, the width of the top surface S' of the connection substrate 122 may be reduced as it approaches the curved area CA. The width of the top surface S' of the connection substrate 122 illustrated in FIG. 9C is larger than the width of the top surface S' of the connection substrate 122 illustrated in FIGS. 9A and 9B. Further, the width of the top surface S' of the connection substrate 122 in FIG. 9B may be larger than the width of the top surface S' of the connection substrate 122 illustrated in FIG. 9A. That is, a width of the top surface S' of the connection substrate 122 may be increased as it approaches the center portion of the straight area SA. In the meantime, a width of the bottom surface of the connection substrate 122 in the straight area SA may be equal to a width of the bottom surface of the connection substrate 122 in the curved area CA.

In the straight area SA, widths W1*a*, W1*b*, and W1*c* in a vertical direction of the first side surface S1 may vary depending on the position. For example, the widths W1*b* and W1*c* in the vertical direction of the first side surface S1 in the straight area SA may be increased as they are closer to the curved area CA and may be minimum in the center portion of the straight area SA. Referring to FIGS. 9A to 9C, the widths W1*b* and W1*c* of the first side surface S1 in the vertical direction illustrated in FIGS. 9B and 9C is relatively smaller than the width W1*a* in the vertical direction of the first side surface illustrated in FIG. 9A. Further, the width W1*c* of the first side surface S1 in the vertical direction is relatively smaller than the width W1*b* of the first side surface S1 illustrated in FIG. 9B in the vertical direction.

In the straight area SA, widths W2*a*, W2*b*, and W2*c* in a vertical direction of the second side surface S2 may vary depending on the position. For example, the widths W2*b* and W2*c* of the second side surface S2 in the straight area SA in the vertical direction may be increased as they are closer to the curved area CA and may be minimum in the center portion of the straight area SA. Referring to FIGS. 9A to 9C, the width W2*c* of the second side surface S2 in the vertical direction illustrated in FIG. 9C may be relatively smaller than the widths W2*a* and W2*b* of the second side surface S2 in the vertical direction illustrated in FIGS. 9A and 9B.

In the meantime, the connection substrate 122 in the straight area SA may include a third side surface S3 configured to connect the first side surface S1 and a bottom surface of the connection substrate 122. Referring to FIGS. 9B and 9C, the third side surface S3 may connect the first side surface S1 and the bottom surface of the connection substrate 122 and the third side surface S3 may have the same tilt angle as the second side surface S2. That is, the third side surface S3 may be perpendicular to the bottom surface of the connection substrate 122.

In the straight area SA, widths W3*a*, W3*b*, and W3*c* of the third side surface S3 in a vertical direction may vary depending on the position. For example, the widths W3*b* and W3*c* of the third side surface S3 in the straight area SA in the vertical direction may be decreased as they are closer to the curved area CA and may be maximum in the center portion of the straight area SA. Referring to FIGS. 9B and 9C, the width W3*c* of the third side surface S3 in the vertical direction illustrated in FIG. 9C is relatively larger than the width W3*b* of the third side surface S3 in the vertical direction illustrated in FIG. 9B.

In the straight area SA, the widths of the second side surface S2 and the third side surface S3 in the vertical direction may vary depending on the position. For example, the widths W2*a*, W2*b*, and W2*c* of the second side surface S2 in the vertical direction may be different from the widths W3*a*, W3*b*, and W3*c* of the third side surface S3 in the vertical direction. Referring to FIG. 9B, the widths W3*a*, W3*b*, and W3*c* of the third side surface S3 in the vertical direction may be smaller than the widths W2*a*, W2*b*, and W2*c* of the second side surface S2 in the vertical direction.

Referring to FIG. 9C, the connection substrate may further include a fourth side surface S4 disposed between the second side surface S2 and the top surface S' of the connection substrate 122. The fourth side surface S4 may be a tilt surface having the same tilt angle as the first side surface S1, but is not limited thereto.

Referring to FIGS. 9A to 9C, the first connection line 181 may be disposed on the connection substrate 122.

The first connection line 181 disposed on the connection substrate 122 may be disposed only on the first side surface S1, between the first side surface S1 and the second side surface S2 of the connection substrate 122. That is, the first connection line 181 is not disposed on the second side surface S2 which is perpendicular to the bottom surface of the connection substrate 122, but is disposed only on the first side surface S1 formed as a tilt surface. At this time, the first connection line 181 may also be disposed on the top surface S' of the connection substrate 122. Accordingly, the first connection line 181 may be disposed to cover the top surface S' and the inclined surface of the connection substrate 122.

Referring to FIGS. 9A to 9C, a thickness of the first connection line 181 disposed on the first side surface S1 of the connection substrate 122 and a thickness of the first connection line 181 disposed on the top surface S' of the connection substrate 122 may be different. Therefore, a cross sectional area of the first connection line 181 which is added may be larger than a cross sectional area of the first connection line 181 which is removed as it moves from the curved area CA to the straight area SA. Specifically, as it moves from the curved area CA to the straight area SA, the width of the first side surface S1 in the vertical direction is reduced so that the width of the first connection line 181 disposed on the first side surface S1 in the vertical direction may be also reduced. In contrast, as it moves from the curved area CA to the straight area SA, the width of the first connection line 181 may be increased in an area disposed to be opposite to the first side surface S1 of the connection substrate 122, that is, in the area in which the top surface S' of the connection substrate 122 is disposed. Specifically, when the straight area SA and the curved area CA are compared, in the straight area SA, a width of the area in which the first side surface S1 is disposed is reduced by X from the straight area SA and a width of the area in which the top surface S' is disposed may be increased by X. For example, as illustrated in FIG. 9A, when a width of the first side surface S1 in a horizontal direction in the curved area CA is (a) and a width of the top surface S' in the horizontal direction is (b), as illustrated in FIG. 9B, a difference of the width of the first side surface S1 in the horizontal direction in the straight area SA and a width of the first side surface S1 in the horizontal direction in the curved area CA is X. Further, the width of the top surface S' in the horizontal direction in the straight area SA may be a sum of the width of the top surface S' in the horizontal direction of the curved area CA and X.

A case that the first side surface S1 which is the curved area CA and the first connection line 181 disposed on the first side surface S1 are in contact with the lower substrate 111 will be described with reference to FIG. 9A. When a tilt angle of the first side surface S1 formed with the bottom surface of the connection substrate 122 is. A thickness of the first connection line 181 disposed on the first side surface S1 is $t_1$, and a thickness of the first connection line 181 disposed on the top surface S' of the connection substrate 122 is $t_2$, a reduced amount of the cross sectional area of the first connection line 181 disposed on the first side surface S1 may be $(X^2/2)\tan$ which corresponds to an area of the triangle. In contrast, an increased amount of the cross sectional area of the first connection line 181 disposed on the top surface S' of the connection substrate 122 may be $t_2X$ which corresponds to an area of a square. At this time, the first connection line 181 may be formed to satisfy $t_2X \geq (X^2/2)\tan$. That is, the first connection line 181 is formed to satisfy $2t_2/t_1 \geq \tan$ to suppress the increase of the resistance of the first connection line 181 in the straight area SA. Therefore, when the first connection line 181 disposed on the first side surface S1 is in contact with the lower substrate 111, the thickness $t_2$ of the first connection line 181 disposed on the top surface S' of the connection substrate 122 may be larger than a half of the thickness $t_1$ of the first connection line 181 disposed on the first side surface S1.

Further, when the first side surface S1 which is the curved area CA and the first connection line 181 disposed on the first side surface S1 are spaced apart from the lower substrate 111, referring to FIG. 9A, a reduced amount of the cross sectional area of the first connection line 181 disposed on the first side surface S1 may be $t_1X$ tan which corresponds to an area of a parallelogram. In contrast, an increased amount of the cross sectional area of the first connection line 181 disposed on the top surface S' of the connection substrate 122 may be $t_2X$ which corresponds to an area of a square. At this time, the first connection line 181 may be formed to satisfy $t_2X \geq t_1X$ tan. That is, the first connection line 181 is formed to satisfy $t_2/t_1 \geq \tan$ to suppress the increase of the resistance of the first connection line 181 in the straight area SA. Therefore, when the first connection line 181 disposed on the first side surface S1 is spaced apart from the lower substrate 111, the thickness $t_2$ of the first connection line 181 disposed on the top surface S' of the connection substrate 122 may be larger than the thickness $t_1$ of the first connection line 181 disposed on the first side surface S1. In the display device of the related art, to reduce the resistance of the connection line, widths of the connection line and the connection substrate expands. In the meantime, when the connection line and the connection substrate expand, the stress is concentrated into the line in accordance with the increased widths of the connection substrate and the connection line so that cracks are likely to occur in the plurality of connection lines, resulting in the disconnection problem. Therefore, to ensure the lifespan of the connection line, the stretching rate of the connection line is improved by reducing a thickness of the connection line, but there may be a problem in that the resistance of the connection line is increased in accordance with the reduction of the thickness of the connection line.

Therefore, in the display device 100 according to the exemplary aspect of the present disclosure, the plurality of connection lines 181 and 182 may be formed to cover the first side surface S1 of the connection substrate 122. By doing this, a cross-sectional area of the plurality of connection lines 181 and 182 which is obliquely disposed is increased to reduce the line resistance.

Further, in the display device 100 according to the exemplary aspect of the present disclosure, an overlapping area of the connection substrate 122 and the connection lines 181 and 182 and the lower substrate 111 may be reduced. That is, a part of the connection substrate 122 and the connection lines 181 and 182 is removed to reduce the width of the connection substrate 122 and the connection lines 181 and 182. Therefore, the stress due to the stretching may be relieved and specifically, the stress in a stress concentrated portion inside the line is easily relieved to improve the stretching rate. Therefore, the fatigue life of the connection lines 181 and 182 may be improved.

Further, in the display device 100 according to the exemplary aspect of the present disclosure, the connection lines 181 and 182 are disposed to have different thicknesses in the top surface S' of the connection substrate 122 and the second side surface S2 of the connection substrate 122. By doing this, the increase of the resistance in the straight area SA may be suppressed. That is, the cross-sectional area of the connection lines 181 and 182 which is increased in the area where the top surface S' of the connection substrate 122 is disposed is formed to be larger than the cross-sectional area of the connection lines 181 and 182 which is decreased in the area where the first side surface S1 is disposed. By doing this, the reduction in the resistance of the connection lines 181 and 182 may be suppressed. Therefore, the signal transfer delay of the connection lines 181 and 182 may also be reduced.

<Another Exemplary Aspect of Present Disclosure>

Figure 11:
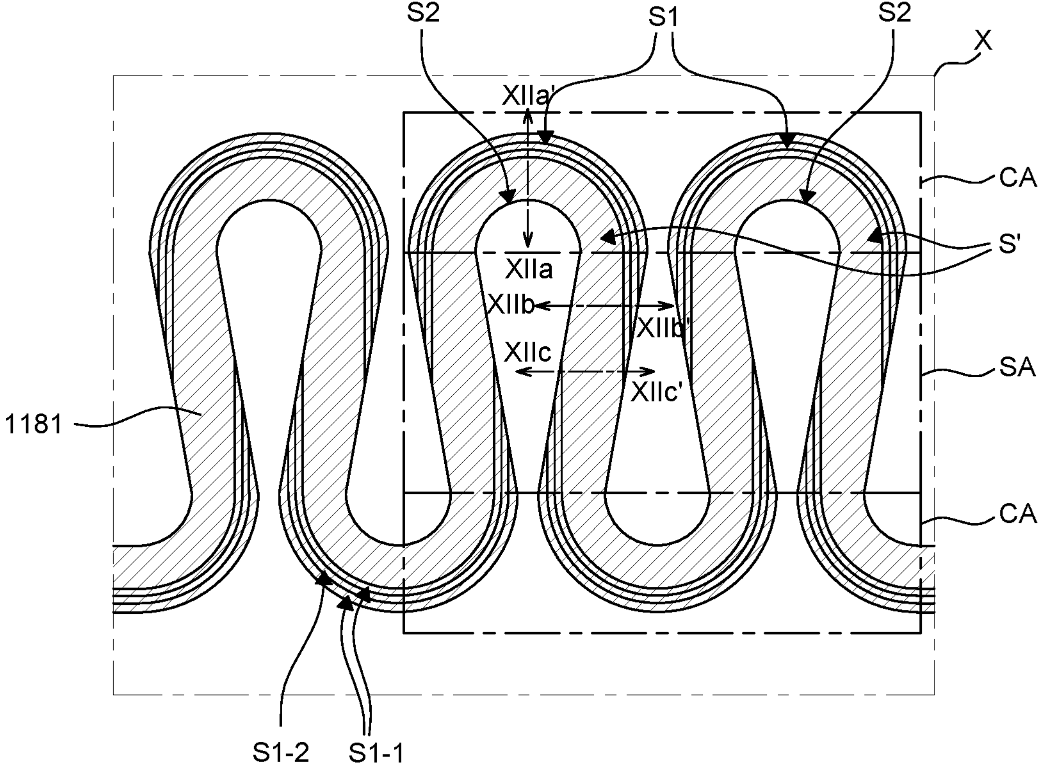
FIG. 11 is an enlarged plan view of an area in which a connection substrate of a display device is disposed according to another exemplary aspect of the present disclosure.
Figure 12A:
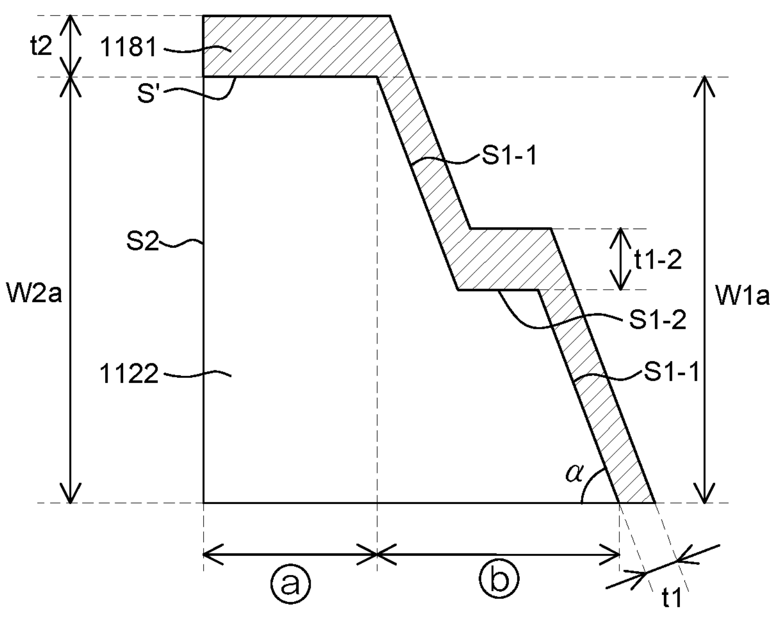
FIG. 12A is a cross-sectional view taken along line XIIa-XIIa' of FIG. 11.
Figure 12B:
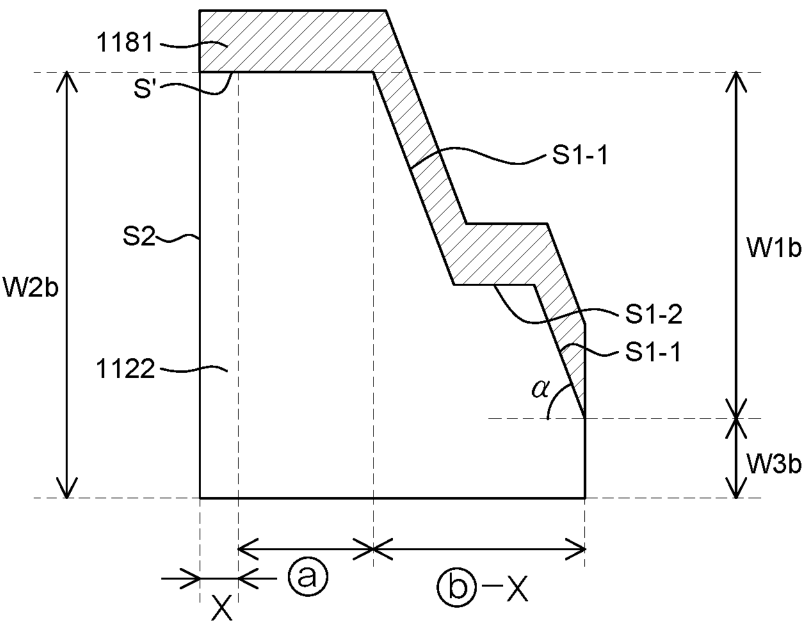
FIG. 12B is a cross-sectional view taken along line XIIb-XIIb' of FIG. 11.
Figure 12C:
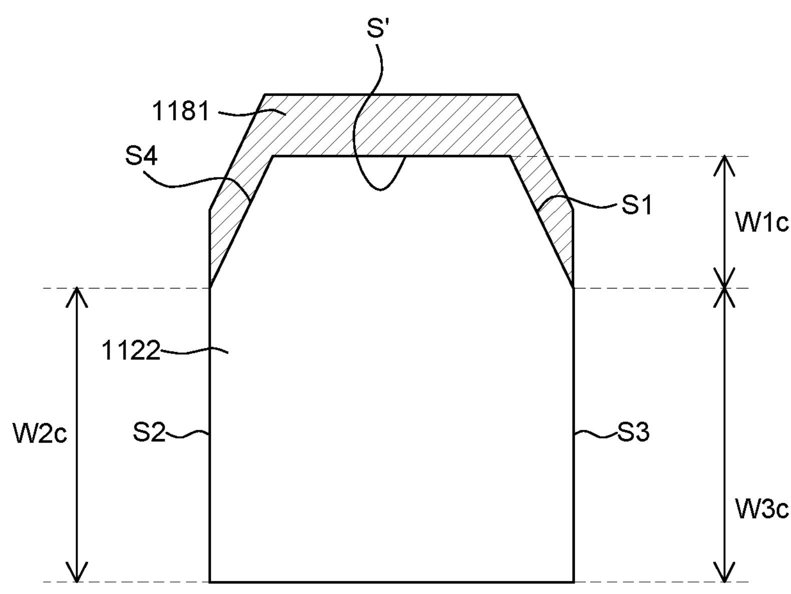
FIG. 12C is a cross-sectional view taken along line XIIc-XIIc' of FIG. 11.

FIG. 11 is an enlarged plan view of an area of a display device according to another exemplary aspect of the present disclosure in which a connection substrate is disposed. FIG. 12A is a cross-sectional view taken along line XIIa-XIIa' of FIG. 11. FIG. 12B is a cross-sectional view taken along line XIIb-XIIb' of FIG. 11. FIG. 12C is a cross-sectional view taken along line XIIc-XIIc' of FIG. 11. FIG. 12A is a cross-sectional view of the curved area CA and FIGS. 12B and 12C are cross-sectional views of the straight area CA. FIG. 12B is a cross-sectional view of an area adjacent to the curved area CA and FIG. 12C is a cross-sectional view of an area which is spaced apart from the curved area CA. Referring to FIGS. 12A to 12C, as compared with the display device 100 of FIGS. 1 to 9C, only a connection substrate 1122 and connection lines 1181 and 1182 of a display device 1100 of FIGS. 11 to 12C are different, but the other components are substantially the same so that a redundant description will be omitted. In FIGS. 11 to 12C, only the first connection line 1181 is illustrated for the sake of convenience, but the second connection line 1182 may also have the same structure as the first connection line 1181.

Referring to FIG. 11, a plurality of connection substrates 1122 and a plurality of first connection lines 1181 have wavy shapes, respectively. Therefore, the plurality of connection substrates 1122 may include a plurality of straight areas SA and a plurality of curved areas CA.

Referring to FIGS. 11 and 12A, in the curved area CA, the connection substrate 1122 may include a top surface S' of the connection substrate 1122 and a first side surface S1 and a second side surface S2 extending from the top surface S' of the connection substrate 1122.

In the curved area CA, a width of the top surface S' of the connection substrate 1122 may be smaller than a width of the bottom surface and may be disposed to be same without varying depending on the position.

Referring to FIGS. 11 and 12A, the first side surface S1 may be disposed on the outer peripheral surface of the connection substrate 1122. The first side surface S1 may be disposed to have a stepped shape. That is, the first side surface S1 may include a plurality of tilt surfaces S1-1 which forms a tilt angle with respect to the top surface S' and the bottom surface of the connection substrate 1122, and may further include a buffer surface S1-2 configured to connect between the plurality of tilt surfaces S1-2. At this time, the plurality of tilt surfaces S1-1 may have the same tilt angle and the buffer surface S1-2 disposed between the plurality of tilt surfaces S1-1 may be parallel to the top surface S' and the bottom surface of the connection substrate 1122.

A second side surface S2 may be disposed on an inner peripheral surface of the connection substrate 1122. The second side surface S2 of the connection substrate 1122 may be disposed to have a different tilt angle from that of the first side surface S1 of the connection substrate 1122. For example, the tilt angle of the second side surface S2 may be perpendicular to the top surface S' and the bottom surface of the connection substrate 1122. Therefore, the tilt angle of the first side surface S1 may be smaller than the tilt angle of the second side surface S2.

Next, the connection substrate 1122 may include a straight area SA disposed between a plurality of curved areas CA.

Referring to FIGS. 11, 12B, and 12C, in the straight area SA, the connection substrate 1122 may include a top surface S' of the connection substrate 1122 and a first side surface S1 and a second side surface S2 extending from the top surface S' of the connection substrate 1122.

Referring to FIG. 11, in the straight area SA, a width of the top surface S' of the connection substrate 1122 may vary depending on the position. The width of the top surface S' of the connection substrate 1122 may be reduced as it approaches the curved area CA.

In the straight area SA, widths W1*a*, W1*b*, and W1*c* in a vertical direction of the first side surface S1 may vary depending on the position. For example, the widths W1*b* and W1*c* in the vertical direction of the first side surface S1 in the straight area SA may be increased as it is closer to the curved area CA and may be minimum in the center portion of the straight area SA. Referring to FIGS. 12A to 12C, the widths W1*b* and W1*c* of the first side surface S1 in the vertical direction illustrated in FIGS. 12B and 12C is relatively smaller than the width W1*a* in the vertical direction of the first side surface illustrated in FIG. 12A. Further, the width W1*c* of the first side surface S1 in the vertical direction is relatively smaller than the width W1*b* of the first side surface S1 illustrated in FIG. 12B in the vertical direction.

In the straight area SA, widths W2*a*, W2*b*, and W2*c* in a vertical direction of the second side surface S2 may vary depending on the position. For example, the widths W2*b* and W2*c* of the second side surface S2 in the straight area SA in the vertical direction may be increased as it is closer to the curved area CA and may be minimum in the center portion of the straight area SA. Referring to FIGS. 12A to 12C, the width W2*c* of the second side surface S2 in the vertical direction illustrated in FIG. 12C may be relatively smaller than the widths W2*a* and W2*b* of the second side surface S2 in the vertical direction illustrated in FIGS. 12A and 12B.

The connection substrate 1122 in the straight area SA may include a third side surface S3 configured to connect the first side surface S1 and a bottom surface of the connection substrate 1122. The third side surface S3 may have the same tilt angle as the second side surface S2.

In the straight area SA, widths W3*a*, W3*b*, and W3*c* of the third side surface S3 in a vertical direction may vary depending on the position. For example, the widths W3*b* and W3*c* of the third side surface S3 in the straight area SA in the vertical direction may be decreased as they are closer to the curved area CA and may be maximum in the center portion of the straight area SA. Referring to FIGS. 12B and 12C, the width W3*c* of the third side surface S3 in the vertical direction illustrated in FIG. 12C is relatively larger than the width W3*b* of the third side surface S3 in the vertical direction illustrated in FIG. 12B.

In the straight area SA, the widths of the second side surface S2 and the third side surface S3 in the vertical direction may vary depending on the position. For example, the widths W2*b* and W2*c* of the second side surface S2 in the vertical direction may be different from the widths W3*b* and W3*c* of the third side surface S3 in the vertical direction. Referring to FIG. 12B, the width W3*b* of the third side surface S3 in the vertical direction is smaller than the width W2*b* of the second side surface S2 in the vertical direction.

Referring to FIG. 12C, a fourth side surface S4 disposed between the second side surface S2 and the top surface S' of the connection substrate 1122 may be further included. The fourth side surface S4 may be a surface having the same tilt angle as the first side surface S1, but is not limited thereto.

Referring to FIGS. 12A to 12C, the first connection line 1181 may be disposed on the connection substrate 1122.

The first connection line 1181 disposed on the connection substrate 1122 may be disposed only on the top surface S' and the first side surface S1, among the top surface S', the first side surface S1, and the second side surface S2 of the connection substrate 1122.

Referring to FIGS. 12A to 12C, a thickness $t_{1-2}$ of the connection substrate 1122 disposed on a side surface of the buffer surface S1-2 disposed between the plurality of tilt surfaces S1-1 of the first side surface S1 may be equal to a thickness $t_2$ of the connection surface 1122 disposed on the top surface S' of the connection substrate 1122. Therefore, as it moves from the curved area CA to the straight area SA, the cross-sectional area of the first connection line 1181 removed from the buffer surface S1-2 of the first side surface S1 may be equal to the cross-sectional area of the first connection line 1181 added onto the top surface S' of the connection substrate 1122. A thickness $t_{1-1}$ of the connection substrate 1122 disposed on the plurality of inclined surfaces S1-1 of the first side surface S1 may be different from a thickness $t_2$ of the first connection line 1181 disposed on the top surface S' of the connection substrate 1122. Therefore, as it moves from the curved area CA to the straight area SA, the cross-sectional area of the first connection line 1181 removed from the plurality of inclined surfaces of the first side surface S1 may be smaller than the cross-sectional area of the first connection line 1181 added onto the top surface S' of the connection substrate 1122.

Therefore, in the display device 1100 according to another exemplary aspect of the present disclosure, the plurality of connection lines 1181 and 1182 are formed to cover the first side surface S1 of the connection substrate 1122 obliquely disposed to reduce the line resistance of the plurality of connection lines 1181 and 1182.

Further, in the display device 1100 according to another exemplary aspect of the present disclosure, an overlapping area of the connection substrate 1122 and the connection lines 1181 and 1182 with the lower substrate 111 is reduced to improve the fatigue life of the connection lines 1181 and 1182.

Further, in the display device 1100 according to another exemplary aspect of the present disclosure, the connection lines 1181 and 1182 are disposed to have different thicknesses in the top surface S' of the connection substrate 1122 and the second side surface S2 of the connection substrate 1122. By doing this, the increase of the resistance in the straight area SA may be suppressed and the signal transfer delay of the connection lines 1181 and 1182 may also be reduced.

The exemplary aspects of the present disclosure may also be described as follows:

According to an aspect of the present disclosure, a display device includes a plurality of pixel substrates disposed on a lower substrate to be spaced apart from each other and where at least one pixel is disposed; a plurality of connection substrates which includes a plurality of curved areas configured to connect a plurality of adjacent pixel substrates, among the plurality of pixel substrates; and a plurality of connection lines configured to electrically connect pads disposed on the plurality of adjacent pixel substrates on the plurality of connection substrates, and the connection substrate includes a first side surface and a second side surface and the second side surface has a different tilt angle from that of the first side surface, thereby improving the stretching reliability.

The connection line may be disposed only on the first side surface, between the second side surface and the first side surface.

A tilt angle of the first side surface may be smaller than a tilt angle of the second side surface.

A tilt angle of the second side surface may be perpendicular with respect to a bottom surface of the connection substrate.

The first side surface may be disposed on an outer peripheral surface of the connection substrate and the second side surface is disposed on an inner peripheral surface of the connection substrate.

The connection line may be further disposed on a top surface of the connection substrate and a thickness of the connection line disposed on the first side surface is different from a thickness of the connection line disposed on a top surface of the connection substrate.

A thickness of the connection line disposed on the top surface of the connection substrate is thicker than a thickness of the connection line disposed on the first side surface.

The first side surface and the connection line disposed on the first side surface may be in contact with the lower substrate.

The plurality of connection substrates may further include a straight area which is straightly disposed between the plurality of curved areas.

In the straight area, the connection substrate may further include a third side surface configured to connect the first side surface and a bottom surface of the connection substrate.

The third side surface may have the same tilt angle as the second side surface.

A width of the second side surface in a vertical direction may be different from a width of the third side surface in the vertical direction.

In the straight area, a connection line disposed on the first side surface may be spaced apart from the lower substrate, and when in the straight area, a thickness of a connection line disposed on the first side surface is t1, a thickness of a connection line disposed on a top surface of the connection substrate is t2, and a tilt angle of the first side surface is, t2/t1≥tan.

In the straight area, a connection line disposed on the first side surface may be in contact with the lower substrate, and when in the straight area, a thickness of a connection line disposed on the first side surface is t1, a thickness of a connection line disposed on a top surface of the connection substrate is t2, and a tilt angle of the first side surface is, 2t2/t1≥tan.

A first side surface disposed in the straight area may be disposed only in an area adjacent to an outer peripheral surface of the curved area, between the inner peripheral surface and the outer peripheral surface of the curved area.

In the straight area, the connection substrate may be diagonally disposed with respect to the side surface of the pixel substrate.

A width of the top surface of the connection substrate in the straight area may be different from a width of the top surface of the connection substrate in the curved area.

The first side surface may have a stepped shape.

In the curved area, a top surface of the connection line may be disposed with the same width.

A width of the top surface of the connection substrate in the straight area may be larger than a width of the top surface of the connection substrate in the curved area.

A width of the bottom surface of the connection substrate in the curved area may be equal to a width of the bottom surface of the connection substrate in the straight area.

It will be apparent to those skilled in the art that various modifications and variations can be made in the display device of the present disclosure without departing from the spirit or scope of the aspects. Thus, it is intended that the present disclosure covers the modifications and variations of the aspects provided they come within the scope of the appended claims and their equivalents.

What is claimed is:

1. A display device, comprising:

a plurality of pixel substrates disposed on a lower substrate spaced apart from one another and at least one pixel disposed on the plurality of pixel substrates;

a plurality of connection substrates which includes a plurality of curved areas configured to connect a plurality of adjacent pixel substrates, among the plurality of pixel substrates; and a plurality of connection lines configured to electrically connect pads disposed on the plurality of adjacent pixel substrates on the plurality of connection substrates, wherein a connection substrate of the plurality of connection substrates includes a first side surface and a second side surface and the second side surface has a tilt angle different from that of the first side surface, wherein the first side surface and the second side surface are disposed to face each other.

2. The display device according to claim 1, wherein a connection line of the plurality of connection lines is disposed only on the first side surface, between the second side surface and the first side surface.

3. The display device according to claim 1, wherein the tilt angle of the first side surface is smaller than the tilt angle of the second side surface.

4. The display device according to claim 3, wherein the tilt angle of the second side surface is perpendicular with respect to a bottom surface of the connection substrate.

5. The display device according to claim 1, wherein the first side surface is disposed on an outer peripheral surface of the connection substrate and the second side surface is disposed on an inner peripheral surface of the connection substrate.

6. The display device according to claim 1, wherein a connection line of the plurality of connection lines is further disposed on a top surface of the connection substrate and a thickness of the connection line disposed on the first side surface is different from a thickness of the connection line disposed on the top surface of the connection substrate.

7. The display device according to claim 6, wherein the thickness of the connection line disposed on the top surface of the connection substrate is thicker than the thickness of the connection line disposed on the first side surface.

8. The display device according to claim 6, wherein the first side surface and the connection line disposed on the first side surface are in contact with the lower substrate.

9. The display device according to claim 1, wherein the plurality of connection substrates further includes a straight area which is straightly disposed between the plurality of curved areas.

10. The display device according to claim 9, wherein in the straight area, the connection substrate further includes a third side surface configured to connect the first side surface and a bottom surface of the connection substrate.

11. The display device according to claim 10, wherein the third side surface has the same tilt angle as the second side surface.

12. The display device according to claim 10, wherein a width of the second side surface in a vertical direction is different from a width of the third side surface in the vertical direction.

13. The display device according to claim 10, wherein in the straight area, a connection line disposed on the first side surface is spaced apart from the lower substrate, and when in the straight area, a thickness of the connection line disposed on the first side surface is t1, a thickness of a connection line disposed on a top surface of the connection substrate is t2, and a tilt angle of the first side surface is $t_2/t_1 \geq \tan$.

14. The display device according to claim 10, wherein the first side surface of the connection substrate disposed in the straight area is disposed only in an area adjacent to an outer peripheral surface of a curved area of the plurality of curved areas, between an inner peripheral surface and the outer peripheral surface of the curved area.

15. The display device according to claim 9, wherein in the straight area, a connection line disposed on the first side surface is in contact with the lower substrate, and when in the straight area, a thickness of the connection line disposed on the first side surface is t1, a thickness of a connection line disposed on a top surface of the connection substrate is t2, and a tilt angle of the first side surface is $2t_2/t_1 \geq \tan$.

16. The display device according to claim 9, wherein in the straight area, the connection substrate is diagonally disposed with respect to a side surface of a pixel substrate of the plurality of pixel substrates.

17. The display device according to claim 9, wherein a width of the top surface of the connection substrate in the straight area is different from a width of the top surface of the connection substrate in a curved area of the plurality of curved areas.

18. The display device according to claim 1, wherein the first side surface has a stepped shape.

19. The display device according to claim 1, wherein in a curved area of the plurality of curved areas, a top surface of a connection line of the plurality of connection lines is disposed with a same width.

20. The display device according to claim 19, wherein a width of a top surface of the connection substrate in a straight area is larger than a width of a top surface of the connection substrate in a curved area of the plurality of curved areas.

21. The display device according to claim 1, wherein a width of a bottom surface of the connection substrate in a curved area of the plurality of curved areas is equal to a width of a bottom surface of the connection substrate in a straight area.

* * * * *